United States Patent
Tsuzuki et al.

(10) Patent No.: US 6,496,086 B2
(45) Date of Patent: Dec. 17, 2002

(54) SAW DEVICE WITH INCLINED REFLECTORS AND COMMUNICATION DEVICE USING SAW DEVICE

(75) Inventors: Shigeru Tsuzuki, Osaka (JP); Tsutomu Igaki, Hyogo (JP); Ken Matsunami, Kyoto (JP); Kazuki Nishimura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/913,043

(22) PCT Filed: Dec. 11, 2000

(86) PCT No.: PCT/JP00/08742

§ 371 (c)(1),
(2), (4) Date: Nov. 13, 2001

(87) PCT Pub. No.: WO01/43284

PCT Pub. Date: Jun. 14, 2001

(65) Prior Publication Data

US 2002/0163402 A1 Nov. 7, 2002

(30) Foreign Application Priority Data

Dec. 9, 1999 (JP) .......................................... 11-349824

(51) Int. Cl.[7] .................................................. H03H 9/64
(52) U.S. Cl. .................................. 333/195; 310/313 D
(58) Field of Search ................................ 333/193–196; 310/313 R, 313 B, 313 C, 313 D

(56) References Cited

U.S. PATENT DOCUMENTS

| 4,114,119 A | * | 9/1978 | Sandy et al. | 333/195 |
|---|---|---|---|---|
| 4,130,813 A | * | 12/1978 | Sandy et al. | 333/194 |
| 4,146,852 A | * | 3/1979 | Godfrey et al. | 333/195 |
| 4,166,228 A | * | 8/1979 | Solie | 310/313 D |
| 4,309,679 A | * | 1/1982 | Furuya et al. | 333/195 |
| 4,319,154 A | * | 3/1982 | Solie | 310/313 D |
| 5,365,206 A | | 11/1994 | Machui et al. | 333/195 |
| 5,424,697 A | * | 6/1995 | Ronnekleiv | 333/195 |
| 5,545,940 A | * | 8/1996 | Wright | 310/313 D |
| 6,075,426 A | * | 6/2000 | Tsutsumi et al. | 333/193 |

FOREIGN PATENT DOCUMENTS

| JP | 56-69919 | 6/1981 |
| JP | 63-9217 | 1/1988 |
| JP | 2-62829 | 5/1990 |
| JP | 55-83320 | 6/1990 |
| JP | 5-501486 | 3/1993 |
| JP | 6-85604 | 3/1994 |
| JP | 10-117123 | 5/1998 |

* cited by examiner

Primary Examiner—Justin P. Bettendorf
Assistant Examiner—Barbara Summons
(74) Attorney, Agent, or Firm—McDermott, Will & Emery

(57) ABSTRACT

A saw device comprises input/output interdigital transducer (IDT) electrodes(11,12) provided on piezoelectric substrates (10), a first reflector electrode (13) following the input IDT electrode (11), and a second reflector electrode (14) preceding the output IDT electrode (12). The device satisfies the following inequality (1) to provide preferable characteristics in a pass band: $2(\theta-5) \leq \tan^{-1}(D/L) \leq 2(\theta+5)$ where $\theta$: the inclination (in degree, except zero) of the first or second reflector electrode of the input and output IDT electrodes with respect to a plane perpendicular to the direction in which surface acoustic waves travel. D: the pitch (in micron) of the input and output IDT electrodes in the direction in which surface acoustic waves travel. L: the pitch (in micron) of the first and second reflector electrodes.

32 Claims, 16 Drawing Sheets

SAW DEVICE WITH INCLINED REFLECTORS AND COMMUNICATION DEVICE USING SAW DEVICE

TECHNICAL FIELD OF THE INVENTION

The present invention relates to a surface acoustic wave (SAW) device for use in radio frequency circuits and the like of a wireless communications device.

BACKGROUND OF THE TECHNOLOGY

In an application where the pass band is relatively wide and the flatness of the phase characteristics within the pass band is important as in filters for use in the IF stage in CDMA devices which are drawing attention in recent years, a surface acoustic wave device is suitable as the amplitude characteristics and the phase characteristics can be independently designed. Also, with the progress of downsizing and weight reduction of mobile terminals, miniaturization of surface acoustic wave devices for IF stage is also being demanded. Accordingly, improved versions of transversal type surface acoustic wave devices are being developed.

In a conventional surface acoustic wave device, as shown in FIG. 14, input and output interdigital transducer electrodes (hereinafter IDT electrodes) 101 and 102 are provided in parallel on a piezoelectric substrate 100, first reflector electrodes 103 are provided between the end on the output side of the input IDT electrode and an end of the piezoelectric substrate 100, and second reflector electrodes 104 are provided between the end on the input side of the output IDT electrode 102 and an end of the piezoelectric substrate 100. Also, the first and second reflector electrodes 103, 104 are obliquely provided relative to the direction perpendicular to the direction of propagation of surface acoustic waves.

When an electrical signal is inputted to the input terminal of this surface acoustic wave device, surface acoustic waves propagate through the input IDT electrode 101, reflect at the first reflector electrodes 103, propagate to the second reflector electrodes 104, reflect at the second reflector electrodes 104, propagate to the output IDT electrode 102, and are put out from the output terminal.

Accordingly, when compared with a transversal type surface acoustic wave device, the size can be made smaller by the amount of overlap of the input and output IDT electrodes 101, 102 in the direction of propagation of surface acoustic waves.

In a surface acoustic wave device having this structure, the state of reflection of surface acoustic waves differs depending on the angle of inclination of the first and second reflector electrodes 103, 104 relative to the input and output IDT electrodes 101, 102, thus affecting the in-passband characteristics.

It is therefore an object of the present invention to provide a surface acoustic wave device that can efficiently transmit surface acoustic waves from the input IDT electrode to the output IDT electrode and hence has a superior in-passband characteristic.

DISCLOSURE OF THE INVENTION

In order to achieve the above object, a first surface acoustic wave device of the present invention comprises a piezoelectric substrate, input and output IDT electrodes provided on the piezoelectric substrate in a manner such that the directions of propagation of surface acoustic waves are in parallel, a first reflector electrode disposed on the side of output of the surface acoustic waves of the input IDT electrode, and a second reflector electrode provided on the side of input of the surface acoustic waves of the output IDT electrode, and satisfies Equation (1). As it can efficiently propagate surface acoustic waves, it provides a superior in-passband characteristic.

$$2(\theta-5) \leq \tan^{-1}(D/L) \leq 2(\theta+5) \quad (1)$$

where

θ: angle of inclination (in degrees excluding zero degree) of the first or the second reflector electrode relative to a plane perpendicular to the direction of propagation of surface acoustic waves of the input and output IDT electrodes;

D: center-to-center distance in μm of the widths of the input and output IDT electrodes in the direction perpendicular to the direction of propagation of surface acoustic waves:

L: center-to-center distance in μm of the first reflector electrode and the second reflector electrode.

In addition, by designing the value of θ to be equal to or smaller than 25°, this device may be made further superior in its in-passband characteristics.

Furthermore, by designing the reflection coefficients of the first and second reflector electrodes to be approximately equal to unity, insertion loss of the device may be lowered.

Yet furthermore, by designing at least one of the input and output IDT electrodes to be a unidirectional electrode, insertion loss of the device may be lowered.

Yet furthermore, by electrically connecting as well as grounding the first and second reflector electrodes of the device with a connect electrode provided between the input and output IDT electrodes, the cable run electrode works as a shielding electrode and prevents electromagnetic coupling between the input and output IDT electrodes thereby increasing the quantity of out-of-passband attenuation.

Yet furthermore, by dividing the first and second reflector electrodes of the device into more than one unit, the quantity of out-of-passband attenuation may be further increased.

Yet furthermore, by making the cable run electrode broader than the bus bars of the input and output IDT electrodes of the device, shielding effect may be further enhanced.

Yet furthermore, with this device, by providing on at least one of the ends on the sides of the input and output IDT electrodes of the first or the second reflector electrodes an electrode finger having the same pitch, width, and angle of inclination as the electrode fingers of the above-mentioned reflector electrodes but shorter in length than the above-mentioned electrode fingers, a filter waveform close to a rectangle may be realized.

Yet furthermore, with this device, by providing at the end on the IDT electrode side of the reflector electrodes provided with a short electrode finger and in parallel with the electrode fingers of the IDT electrodes an electrode finger, having a width approximately equal to ⅛ of the wavelength of surface acoustic waves, for connecting ends of electrode fingers, unwanted reflection may be prevented.

Yet furthermore, with this device, by making the reflection characteristics of the first reflector electrodes and the second reflector electrodes different, the quantity of out-of-passband attenuation may be increased.

Yet furthermore, with this device, by making the metalization ratios of the first and second reflector electrodes to be in the range 0.45 to 0.75, reflection efficiency per electrode finger of the reflector electrodes may be enhanced thus enabling size reduction of the reflector electrodes.

Yet furthermore, with this device, the quantity of out-of-passband attenuation may be increased by making the width of some of the electrode fingers of the reflector electrodes greater than the width of other electrode fingers.

Yet furthermore, with this device, by providing a third reflector electrode on the side opposite the side where the first reflector electrode of the input IDT electrode is provided at a predetermined distance from the input IDT electrode, and providing a fourth reflector electrode on the side opposite the side where the second reflector electrode of the output IDT electrode is provided at a predetermined distance from the output IDT electrode, bi-directional surface acoustic waves propagating through the input IDT electrode may be efficiently propagated to the output IDT electrode.

Yet furthermore, with this device, by configuring at least one of the input and output IDT electrodes with a split electrode having an electrode finger width approximately equal to $\lambda/8$ ($\lambda$: wavelength of surface acoustic waves), internal reflection within the input and output IDT electrodes may be prevented and a wide and flat pass band may be provided.

Yet furthermore, with this device, when the input and output terminals of the surface acoustic wave device are of unbalanced type, by grounding the input and output terminals on the side of opposing input and output IDT electrodes, electromagnetic coupling between the input and output IDT electrodes may be prevented and a large quantity of out-of-passband attenuation may be obtained.

Yet furthermore, with this device, by providing an acoustic absorber between the first and second reflector electrodes and the end in the direction of propagation of surface acoustic waves of the piezoelectric substrate, unwanted reflected waves at the end of the piezoelectric substrate may be absorbed and a flat pass band may be obtained.

Yet furthermore, with this device, by providing a sound-absorbing material also between the first and second reflector electrodes and the end parallel to the direction of propagation of surface acoustic waves of the piezoelectric substrate, unwanted reflected waves at the end of the piezoelectric substrate may be further absorbed and a flat pass band may be obtained.

A second surface acoustic wave device of the present invention comprises a piezoelectric substrate, input and output IDT electrodes provided in parallel on the piezoelectric substrate, first to fourth reflector electrodes provided on both sides of the input and output IDT electrodes, and a fifth reflector electrode provided between the input and output IDT electrodes, where the first to the fourth reflector electrodes are inclined by roughly the same angles relative to a plane perpendicular to the direction of propagation of surface acoustic waves, thus providing a surface acoustic wave device small in size and superior in the quantity of out-of-passband attenuation.

Additionally, with this device, by satisfying Equation (2), surface acoustic waves may be efficiently propagated.

$$2(\theta-5) \leq \tan^{-1}(D/L) \leq 2(\theta+5) \quad (2)$$

where

θ: angle of inclination (in degrees excluding zero degree) of one or more of the first to the fourth reflector electrodes relative to a plane perpendicular to the direction of propagation of surface acoustic waves of the input and output IDT electrodes;

D: center-to-center distance in $\mu$m of the widths of the input and output IDT electrodes in the direction perpendicular to the direction of propagation of surface acoustic waves;

L: center-to-center distance in $\mu$m of the first reflector electrode and the second reflector electrode.

In addition, by designing the value of θ to be equal to or smaller than 25°, this device may be made further superior in its in-passband characteristics.

Furthermore, by designing the reflection coefficients of the first to fifth reflector electrodes to be approximately equal to unity, insertion loss of the device may be lowered.

Yet furthermore, with this device, by configuring at least one of the input and output IDT electrodes with a split electrode having an electrode finger width approximately equal to $\lambda/8$ ($\lambda$: wavelength of the surface acoustic wave), internal reflection inside the input and output IDT electrodes may be prevented and a wide and flat pass band may be provided.

Yet furthermore, with this device, by making the fifth reflector electrode work as a shielding electrode by grounding it, electromagnetic coupling between the input and output IDT electrodes may be prevented thus providing a device having a large quantity out-of-passband attenuation.

Yet furthermore, with this device, by providing on at least one of the ends on the side of the input and output IDT electrodes of the first to the fourth reflector electrodes an electrode finger having the same pitch, width, and angle of inclination as the electrode fingers of the reflector electrodes but shorter in length than the electrode fingers, a filter waveform close to a rectangle may be obtained.

Yet furthermore, with this device, by providing at the end on the IDT electrodes side of the reflector electrode provided with a short electrode finger and in parallel with the electrode fingers of the IDT electrodes an electrode finger having a width approximately equal to ⅛ of the wavelength of surface acoustic waves for connecting ends of electrode fingers, unwanted reflection may be prevented.

Yet furthermore, with this device, by making the reflection characteristics of the first and second reflector electrodes different from those of the third and fourth reflector electrodes, the quantity of out-of-passband attenuation may be increased.

Yet furthermore, with this device, by making the metalization ratios of the first to the fifth reflector electrodes to be in the range 0.45 to 0.75, reflection efficiency per electrode finger may be enhanced thus enabling size reduction of the reflector electrodes.

Yet furthermore, with this device, the quantity of out-of-passband attenuation may be increased by making the width of some of the electrode fingers of at least one of the first to the fifth reflector electrodes greater than the width of other electrode fingers.

Yet furthermore, with this device, when the input and output terminals of the surface acoustic wave device are of unbalanced type, by grounding the input and output terminals on the side of opposing input and output IDT electrodes, electromagnetic coupling between the input and output IDT electrodes may be prevented and a large quantity of out-of-passband attenuation may be obtained.

Yet furthermore, with this device, by providing a sound-absorbing material between the first to the fifth reflector electrodes and the end of the piezoelectric substrate in the direction of propagation of surface acoustic waves, unwanted reflected waves at the end of the piezoelectric substrate may be absorbed and a flat pass band may be obtained.

Yet furthermore, with this device, by providing a sound-absorbing material also between the first to the fourth reflector electrodes and the end of the piezoelectric substrate in the direction parallel to the direction of propagation of surface acoustic waves, unwanted reflected waves at the end of the piezoelectric substrate may be further absorbed and a flat pass band may be obtained.

A communications device in accordance with the present invention is one including a mixer, a surface acoustic wave device in accordance with the present invention of which the input side is connected to the output side of the mixer, and an amplifier of which the input side is connected to the output side of the surface acoustic wave device, and enabling reduction in the number of factors related to amplifier elements, or reduction in the amplifier power dissipation thus providing superior cost performance.

DESCRIPTION OF THE PREFERRED EMBODIMENTS

Referring to drawings, a description will be given below on exemplary embodiments of the present invention.

Exemplary Embodiment 1

Figure 1:
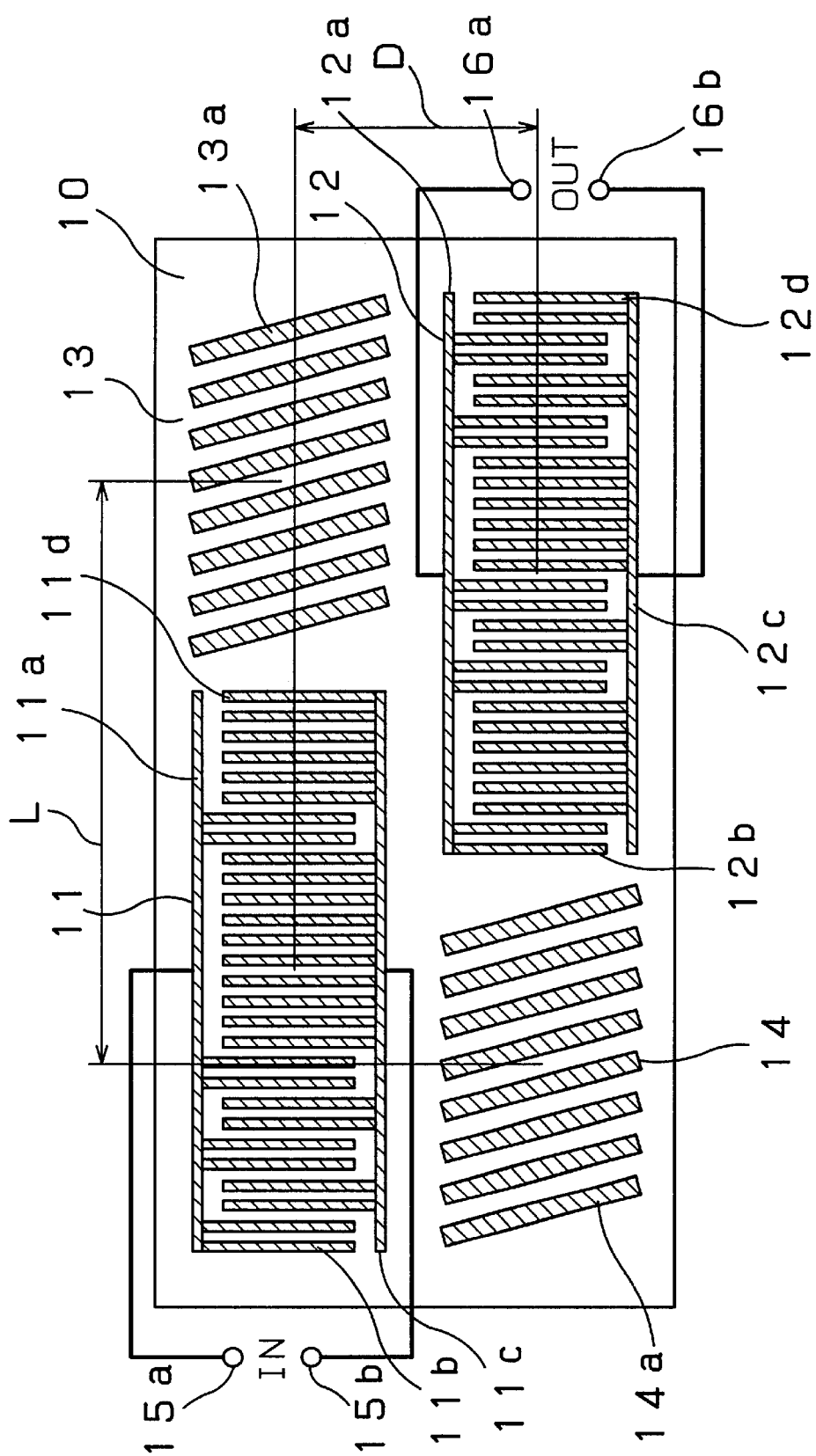
FIG. 1 is a top view of a surface acoustic wave device in a first exemplary embodiment of the present invention.

FIG. 1 is a top view of a surface acoustic wave device in a first exemplary embodiment of the present invention.

In this surface acoustic wave device, an input IDT electrode 11 and an output IDT electrode 12 are provided on a piezoelectric substrate 10 parallel to the main direction of propagation of surface acoustic waves (hereinafter referred to as direction of propagation of surface acoustic waves) in a manner such that one of their ends overlap.

The input IDT electrode 11 is so structured that a plurality of electrode fingers 11b on the positive electrode side connected to a busbar 11a on the positive electrode side and a plurality of electrode fingers 11d on the negative electrode side connected to a busbar 11c on the negative electrode side are interdigitated thus being connected to input terminals 15a, 15b through the busbars 11a, 11c.

The output IDT electrode 12 is so structured that a plurality of electrode fingers 12b on the positive electrode side connected to a busbar 12a on the positive electrode side and a plurality of electrode fingers 12d on the negative electrode side connected to a busbar 12c on the negative electrode side are interdigitated thus being connected to output terminals 16a, 16b through the busbars 12a, 12c.

The structure of the electrode fingers 11b, 11d, 12b, 12d is such that they are of approximately the same length with a width approximately equal to ⅛ of the wavelength of the surface acoustic waves and disposed at the same pitch, and both the input IDT electrode 11 and the output IDT electrode 12 are of split electrode structure to prevent internal reflection.

Also, first reflector electrodes 13 are provided at the end of the input IDT electrode 11 on the side of the output IDT electrode 12 at a predetermined distance from the input IDT electrode 11, while second reflector electrodes 14 are provided at the end of the output IDT electrode 12 on the side of the input IDT electrode 11 at a predetermined distance from the output IDT electrode 12. Furthermore, electrode fingers 13a and 14a are inclined so that the angle between a plane perpendicular to the direction of propagation of the surface acoustic waves and the electrode fingers 13a, 14a is 25 or smaller. The first and the second reflector electrodes 13, 14 are made by respectively disposing at the same pitch electrode fingers 13a, 14a having approximately the same width and length, and have reflection coefficient of approximately unity. Consequently, the external configuration of the first and second reflector electrodes 13, 14 is roughly a parallelogram. Furthermore, the widths of the first and second reflector electrodes 13, 14 in the direction perpendicular to the direction of propagation of the surface acoustic waves are made to be equal to or greater than the widths in the same direction of the input and output IDT electrodes 11, 12.

Furthermore, the input and output IDT electrodes 11, 12, and the first and second reflector electrodes 13, 14 are formed at positions on the piezoelectric substrate 10 that satisfy Equation (1).

In a surface acoustic wave device having the above structure, when an electric signal is inputted from the input terminals 15a, 15b to the input IDT electrode 11, surface acoustic waves are propagated to the first reflector electrodes 13, reflected by the first reflector electrodes 13, and propagated to the second reflector electrodes 14. Subsequently, the surface acoustic waves reflected for the second time by the second reflector electrodes 14 are propagated to the output IDT electrode 12 and taken out at the output terminals 16a, 16b as an electric signal. In other words, though the surface acoustic waves take a Z-shaped propagation route, as the first and second reflector electrodes 13, 14 can efficiently reflect the surface acoustic waves that have propagated through the input IDT electrode 11 and propagate to the output IDT electrode 12, a surface acoustic wave device having a low insertion loss and a flat pass band characteristic may be provided.

Exemplary Embodiment 2

Figure 2:
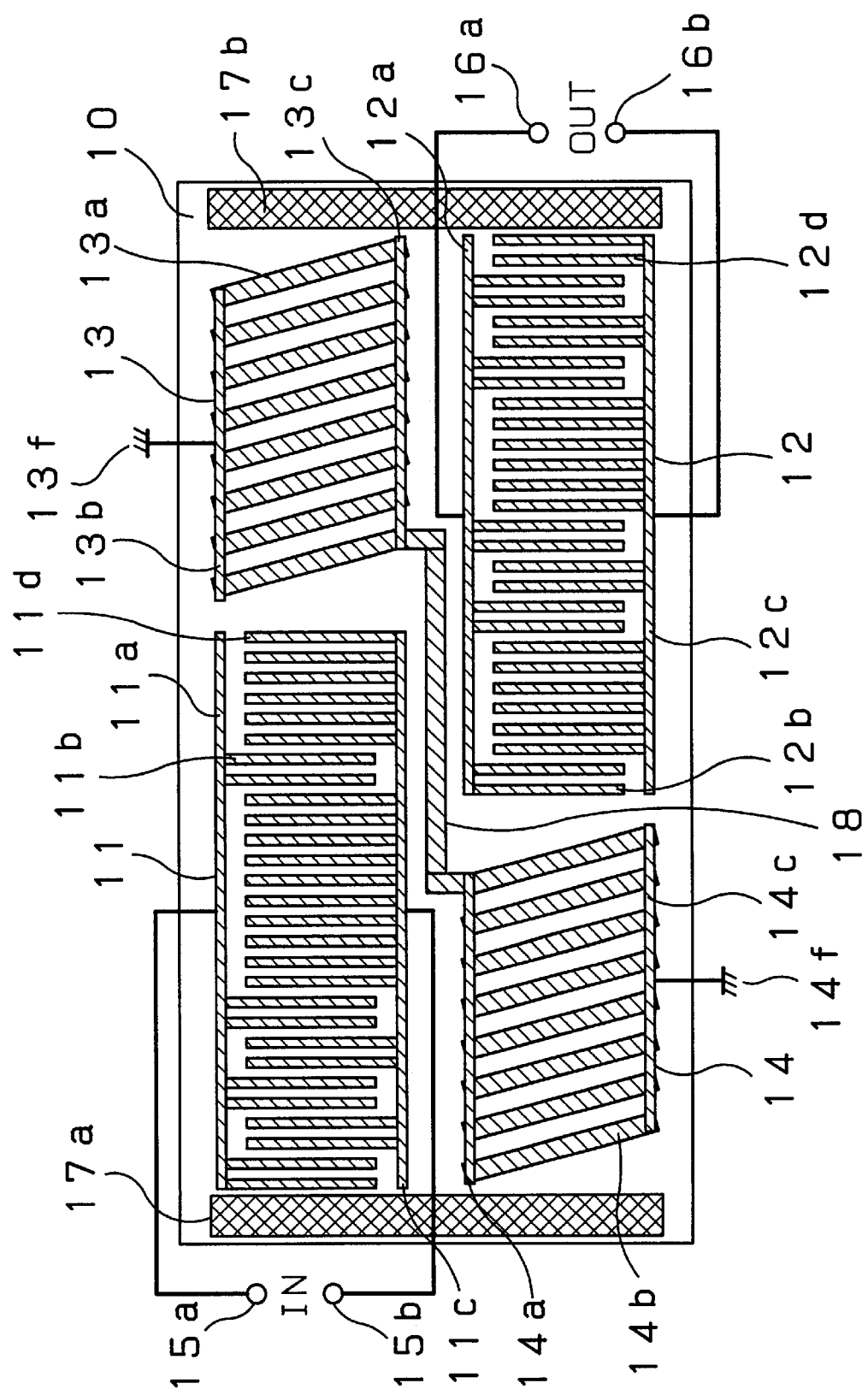
FIG. 2 is a top view of a surface acoustic wave device in a second exemplary embodiment of the present invention.

FIG. 2 is a top view of a surface acoustic wave device in a second exemplary embodiment of the present invention.

Structural elements similar to those in FIG. 1 are designated by the same reference numerals and description will be omitted.

A description will now be given on the points of difference from the first exemplary embodiment. In this second exemplary embodiment, sound-absorbing materials 17a, 17b are formed respectively between an input IDT electrode 11, a second reflector electrode 14 and an end of a piezoelectric substrate 10, and between an output IDT electrode 12, a first reflector electrode 13 and an end of the piezoelectric substrate 10.

By forming the sound-absorbing materials 17a, 17b, unwanted reflection of surface acoustic waves at the ends in the direction of propagation of the piezoelectric substrate 10 may be prevented thereby realizing a flat pass band.

Furthermore, electrode fingers 13a, 14a of the first reflector electrode 13 and the second reflector electrode 14 are electrically connected with busbars 13b, 13c, 14b, 14c; the busbars 13c, 14b are electrically connected with a cable run electrode 18: and the busbars 13b, 14c are connected to grounding terminals 13f, 14f. The cable run electrode 18 is provided on the piezoelectric substrate 10 between the input IDT electrode 11 and the output IDT electrode 12 in a manner such that it has a width greater than the widest portion of the input and output IDT electrodes 11, 12, that is, the width of the busbars 11a, 11c, 12a, 12c, thereby further enhancing shielding effect and preventing electromagnetic coupling between the input and output IDT electrodes 11, 12 thus achieving an increase in the quantity of out-of-passband attenuation.

Exemplary Embodiment 3

Figure 3A:
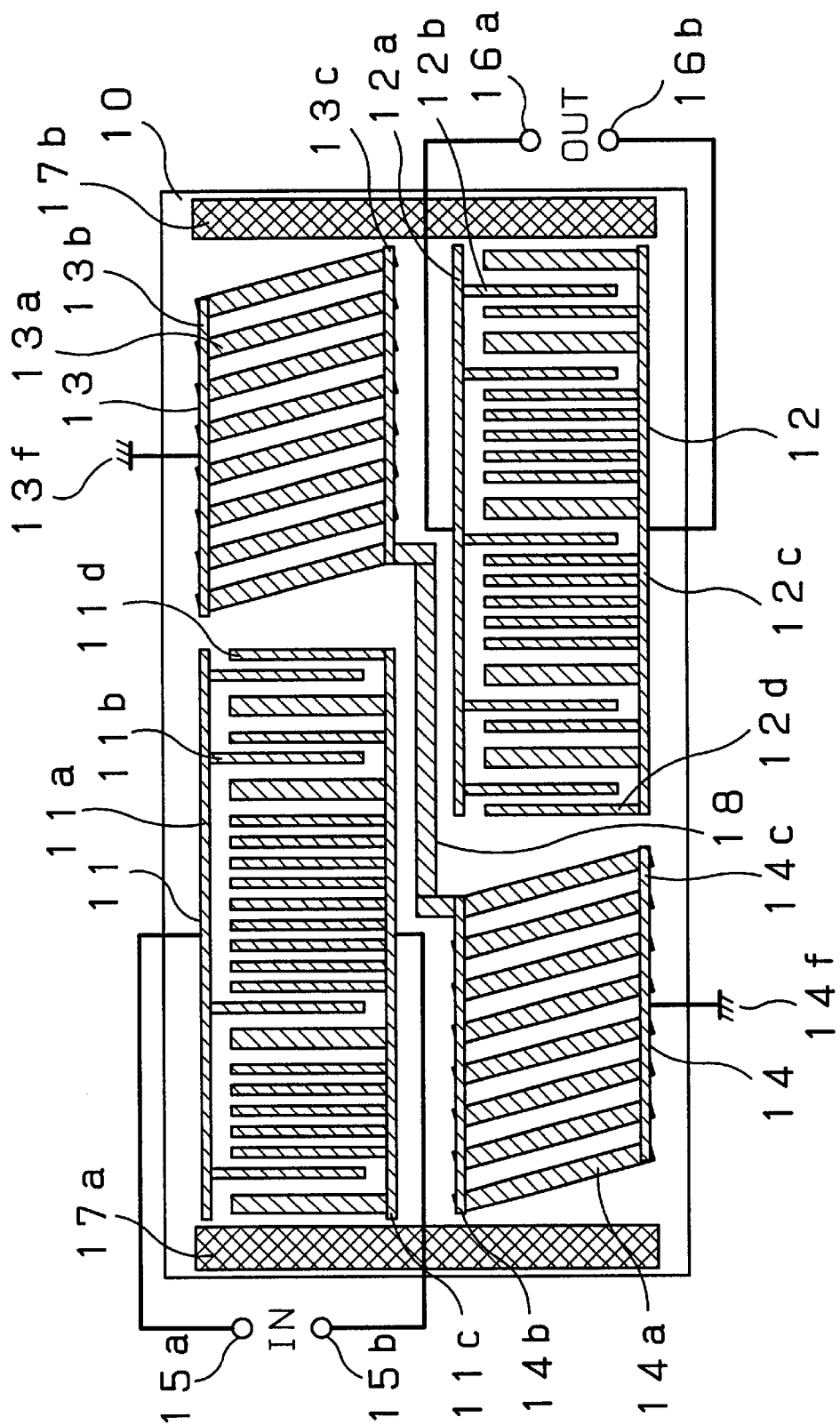
FIG. 3(a) is a top view of a surface acoustic wave device in a third exemplary embodiment of the present invention.

FIG. 3(a) and (b) are top views of a surface acoustic wave device in a third exemplary embodiment of the prevent invention. Structural elements similar to those in FIG. 2 are designated by the same reference numerals and description will be omitted.

The point of difference of the surface acoustic wave device of this third exemplary embodiment from the surface acoustic wave device of the second exemplary embodiment lies in the structure of the electrode fingers 11b, 11d, 12b, 12d of the input and output IDT electrodes 11, 12; that is, the width and layout of the electrode fingers 11b, 11d, 12b, 12d have been changed so that the input and output IDT electrodes 11, 12 become unidirectional. By employing this structure, insertion loss may be reduced by reducing directivity loss in the input and output IDT electrodes 11, 12.

While insertion loss may be reduced when compared with the surface acoustic wave device of the second exemplary embodiment by making either one of the input and output IDT electrodes 11, 12 unidirectional, insertion loss may be further reduced by making both electrodes unidirectional.

Figure 3B:
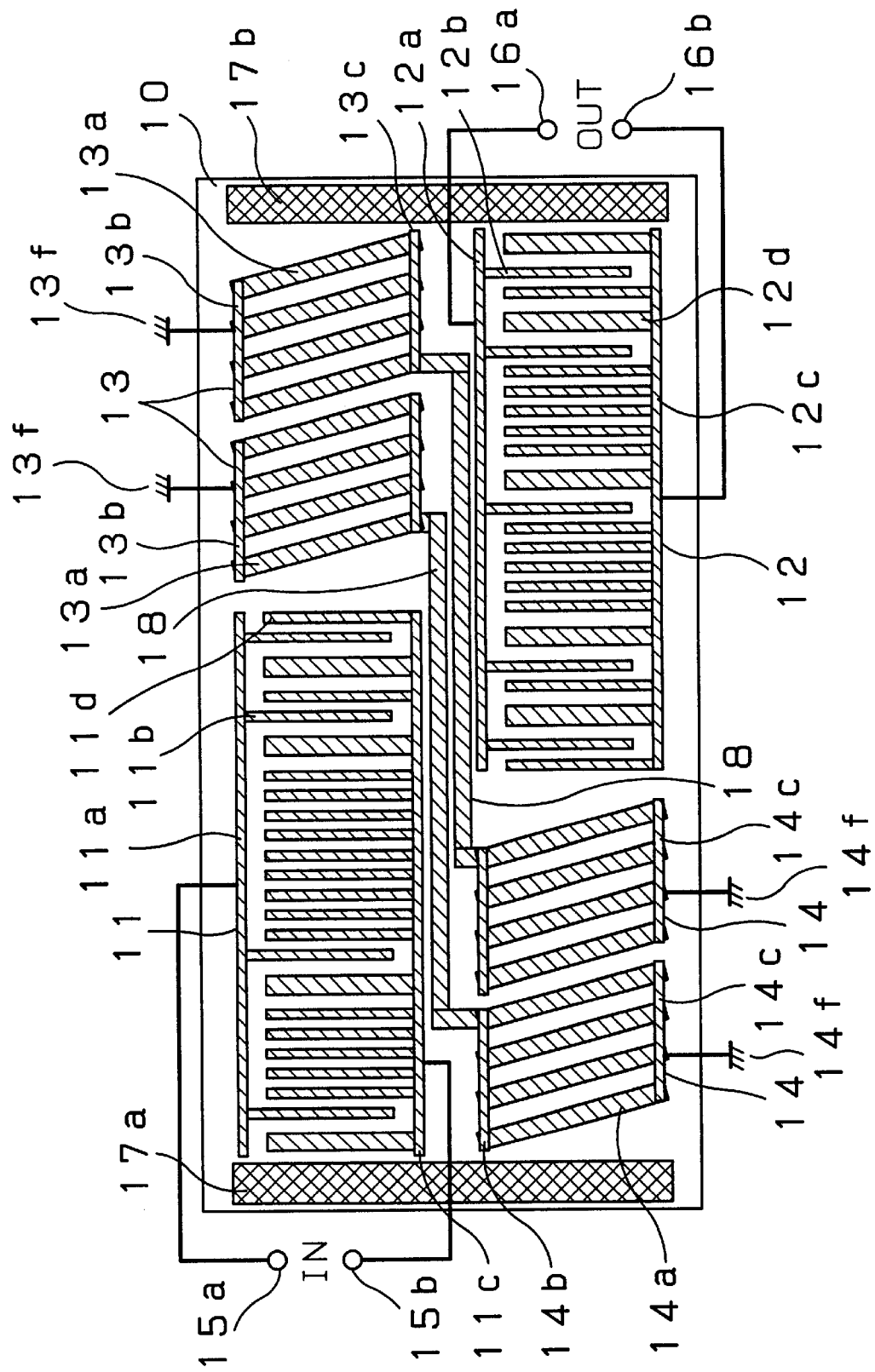
FIG. 3(b) is a top view of a surface acoustic wave device in the third exemplary embodiment of the present invention.

By dividing the first and second reflector electrodes 13, 14 into plural units and connecting them with a respective cable run electrode 18 as shown in FIG. 3(b) and at the same time connecting the busbars 13b, 14c to respective grounding terminals 13f, 14f, the quantity of out-of-band attenuation is expected to be further increasable than before division. However, it is not desirable because, as the number of division increases, the width of the cable run electrode 18 has to be made smaller thus resulting in an increase in resistance loss. Consequently, in order to increase the quantity of out-of-passband attenuation without increasing the resistance loss, it is preferable that each of the reflectors divided into two be of approximately the same size.

Exemplary Embodiment 4

Figure 4:
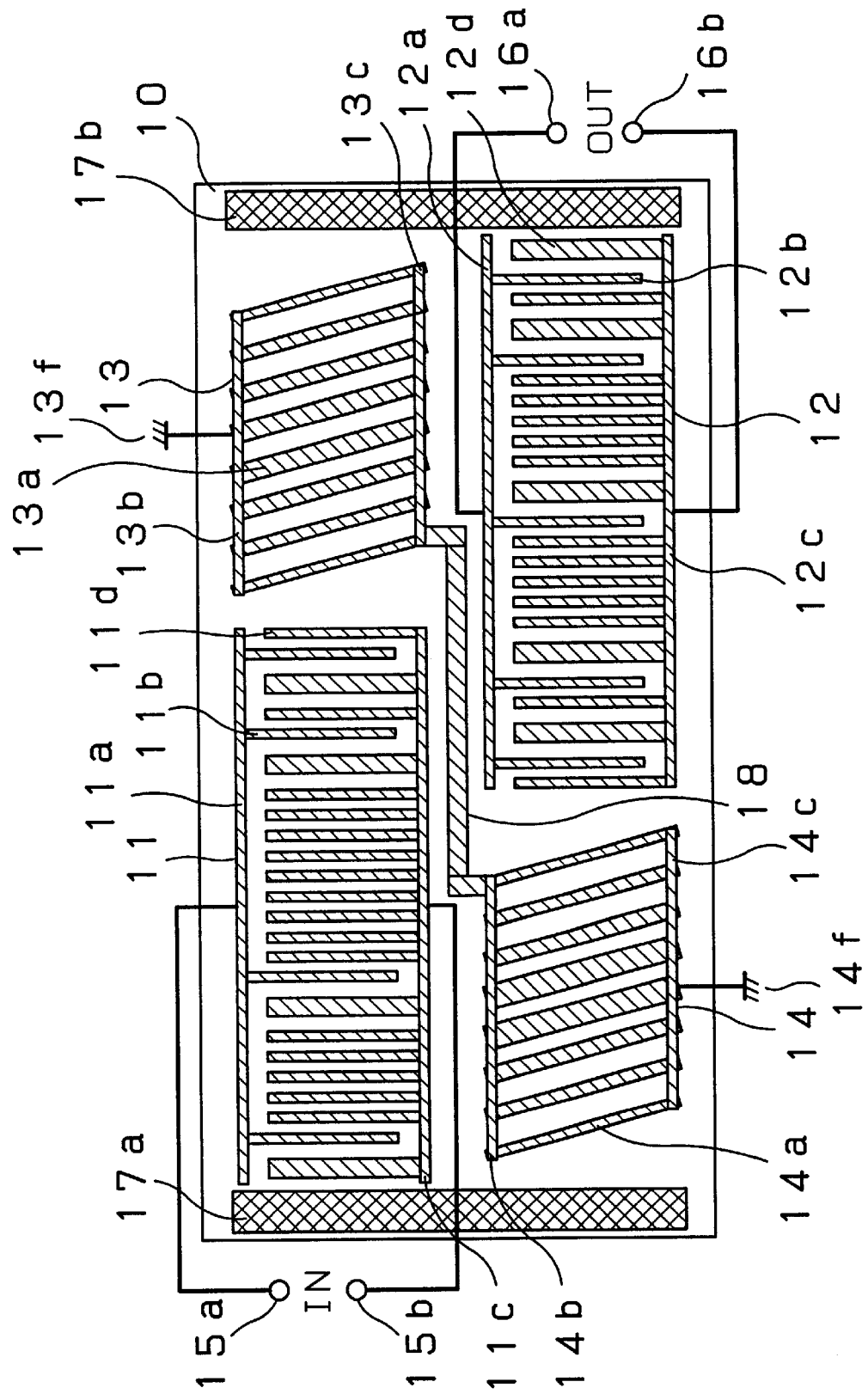
FIG. 4 is a top view of a surface acoustic wave device in a fourth exemplary embodiment of the present invention.

FIG. 4 is a top view of a surface acoustic wave device in a fourth exemplary embodiment of the present invention. Structural elements that are the same as those in FIG. 3 are designated by the same reference numerals and description will be omitted.

The point of difference of the surface acoustic wave device of this fourth exemplary embodiment from that of the third exemplary embodiment lies in the structure of the electrode fingers 13a, 14a of the first and the second reflector electrodes 13, 14. While the electrode fingers 13a, 14a were of the same shape and pitch in the third exemplary embodiment, the first and second reflector electrodes 13a, 14a in the fourth exemplary embodiment are formed by using electrode fingers 13a, 14a having different widths thereby changing the magnitude of reflection (reflection coefficient, etc.) inside the first and second reflection electrodes 13, 14.

By assigning weights to the reflection characteristics of the first and second reflector electrodes 13, 14 in this way, the out-of-passband reflection efficiency is reduced thus enabling an increase in the quantity of out-of-passband attenuation.

By the way, by gradually changing the widths when changing the electrode fingers 13a, 14a, precise weighting may be made possible thus providing arbitrary reflection characteristic.

Furthermore, in the fourth exemplary embodiment, by changing the electrode finger pitch while keeping the width of the electrode fingers 13a, 14a the same, similar effect may be obtained by changing the phase of the reflected waves. In this case too, it is preferable to gradually change the electrode finger pitch.

Exemplary Embodiment 5

Figure 5A:
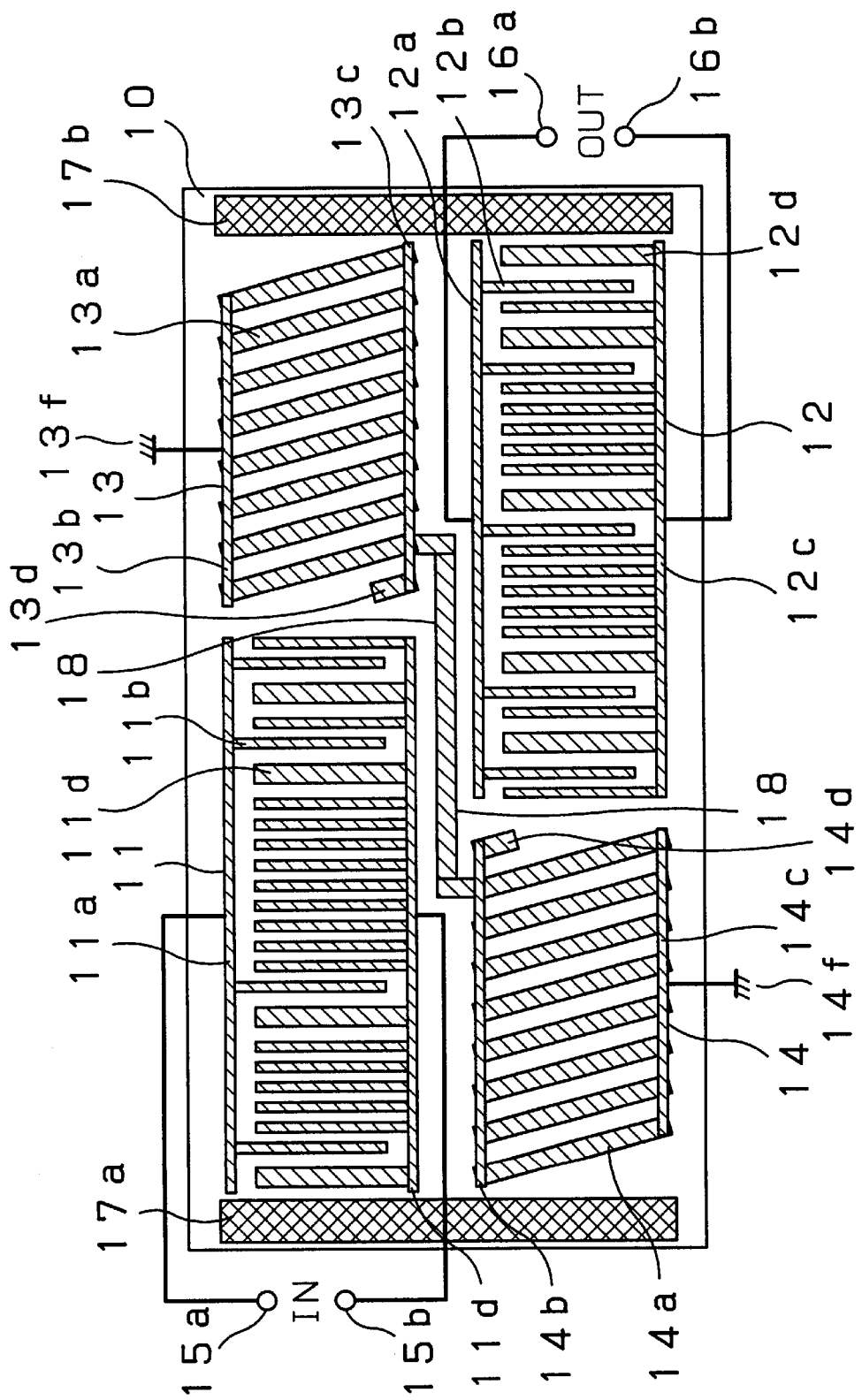
FIG. 5(a) is a top view of a surface acoustic wave device in a fifth exemplary embodiment of the present invention.

FIG. 5(a) and (b) are top views of a surface acoustic wave device in a fifth exemplary embodiment of the present invention. Structural elements that are the same as those in FIG. 3 are designated by the same reference numerals and description will be omitted.

In FIG. 5, electrode fingers 13d, 14d having the same width and pitch as electrode fingers 13a, 14a are provided next to the comb electrodes 13a, 14a on the side of input and output IDT electrodes 11, 12 with one end being connected to busbars 13c, 14b. The comb electrodes 13d, 14d are made to a length such that the shortest distance between the other ends of the comb electrodes 13d, 14d and the input and output IDT electrodes 11, 12 is not shorter than the shortest distance between the first and second reflector electrodes 13, 14 and the input and output IDT electrodes 11, 12 in FIG. 3.

By employing this structure, reflector electrodes having higher reflection efficiency may be formed in a limited space thus providing a surface acoustic wave device having a filter waveform close to a rectangle, namely, a device having attenuation characteristic which is steep near the pass band.

Figure 5B:
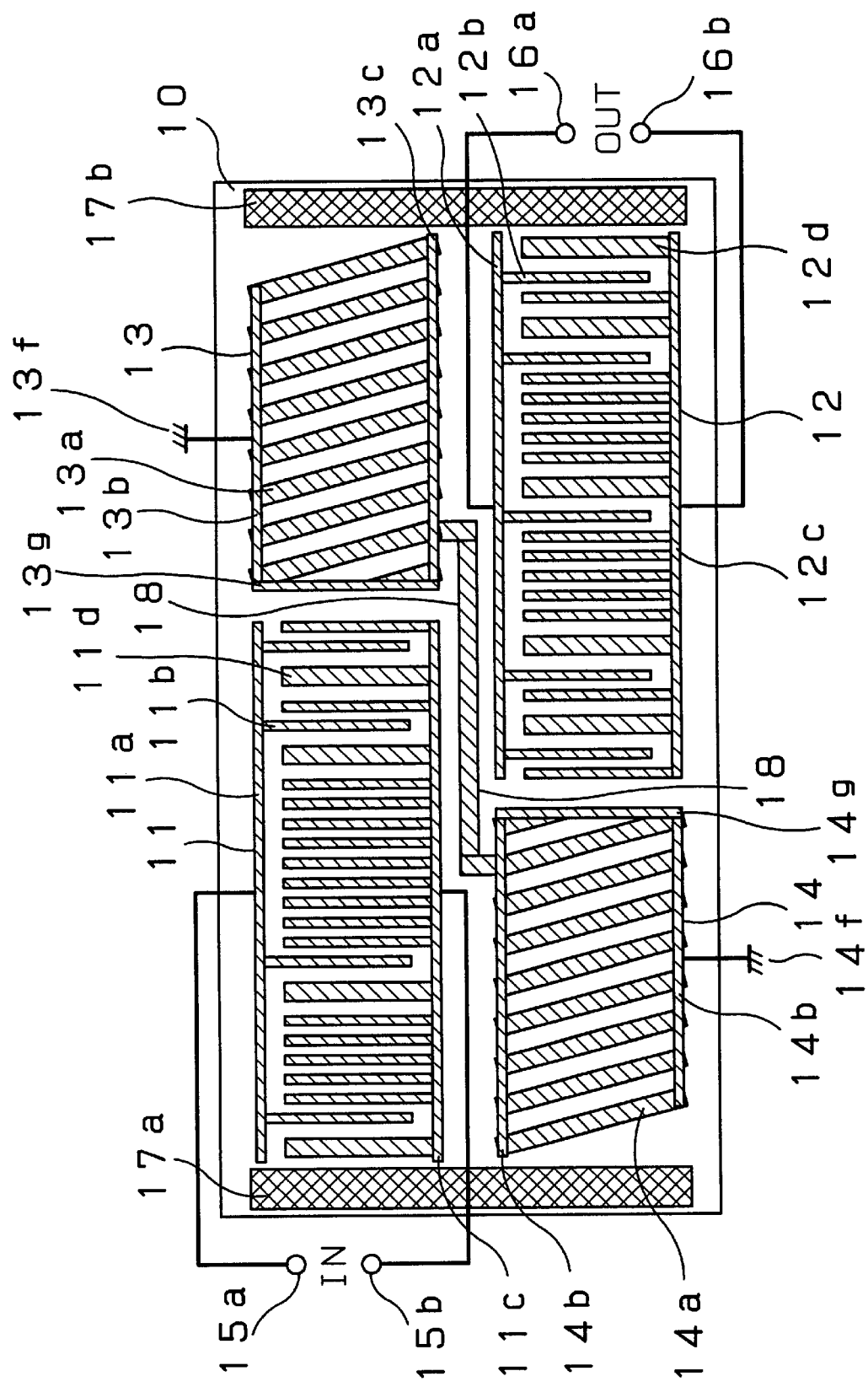
FIG. 5(b) is a top view of a surface acoustic wave device in the fifth exemplary embodiment of the present invention.

In the meantime, as shown in FIG. 5(b), by providing at the ends on the side of the input and output IDT electrodes 11, 12 of the first and second reflector electrodes 13, 14 and in parallel with the electrode fingers 11d, 12d, electrode fingers 13g, 14g having a width equal to ⅛ of the wavelength of surface acoustic waves and to which ends of the electrode fingers 13a, 13d, 14a, 14d are to be connected, unwanted reflection may be prevented.

Exemplary Embodiment 6

Figure 6:
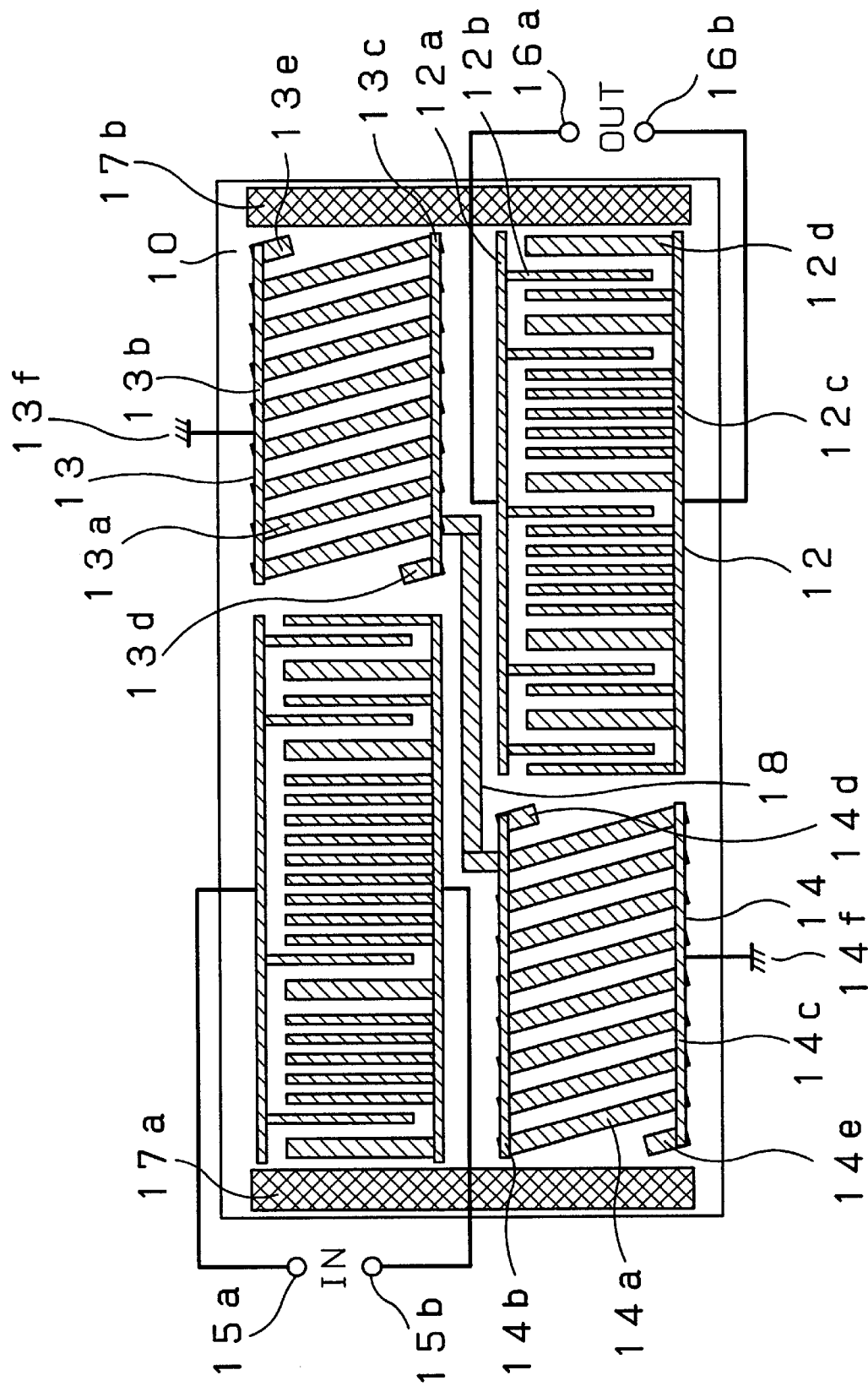
FIG. 6 is a top view of a surface acoustic wave device in a sixth exemplary embodiment of the present invention.

FIG. 6 is a top view of a surface acoustic wave device in a sixth exemplary embodiment of the present invention. Structural elements that are the same as those in FIG. 5 are designated by the same reference numerals and description will be omitted.

The point of difference of the sixth exemplary embodiment from the fifth exemplary embodiment lies in that electrode fingers 13e, 14e are provided in the first and second reflector electrodes 13, 14.

The electrode fingers 13e, 14e have the same width and pitch as the electrode fingers 13a, 14a and are provided next to the comb electrodes 13a, 14a toward the ends of a piezoelectric substrate 10 with one end being connected to busbars 13b, 14c. Also, the comb electrodes 13e, 14e are made to a length such that the shortest distance between the other end of the comb electrodes 13e, 14e and an end of the piezoelectric substrate 10 is not shorter than the shortest distance between the first and second reflector electrodes 13, 14 and an end of the piezoelectric substrate 10 in FIG. 5.

By employing this structure, reflector electrodes having reflection efficiency higher than that of the first and second reflector electrodes 13, 14 as shown in FIG. 5 may be formed thus providing a surface acoustic wave device having a filter waveform closer to a rectangle.

In this sixth exemplary embodiment, too, as in the fifth exemplary embodiment by providing at the ends of the first and second reflector electrodes 13, 14 in parallel with the electrode fingers 11d, 12d, electrode fingers 13g, 14g having a width equal to ⅛ of the wavelength of surface acoustic waves and to which ends of the electrode fingers 13a, 13b, 13d, 13e, 14a, 14b, 14d, 14e are to be connected, unwanted reflection may be prevented.

Exemplary Embodiment 7

Figure 7:
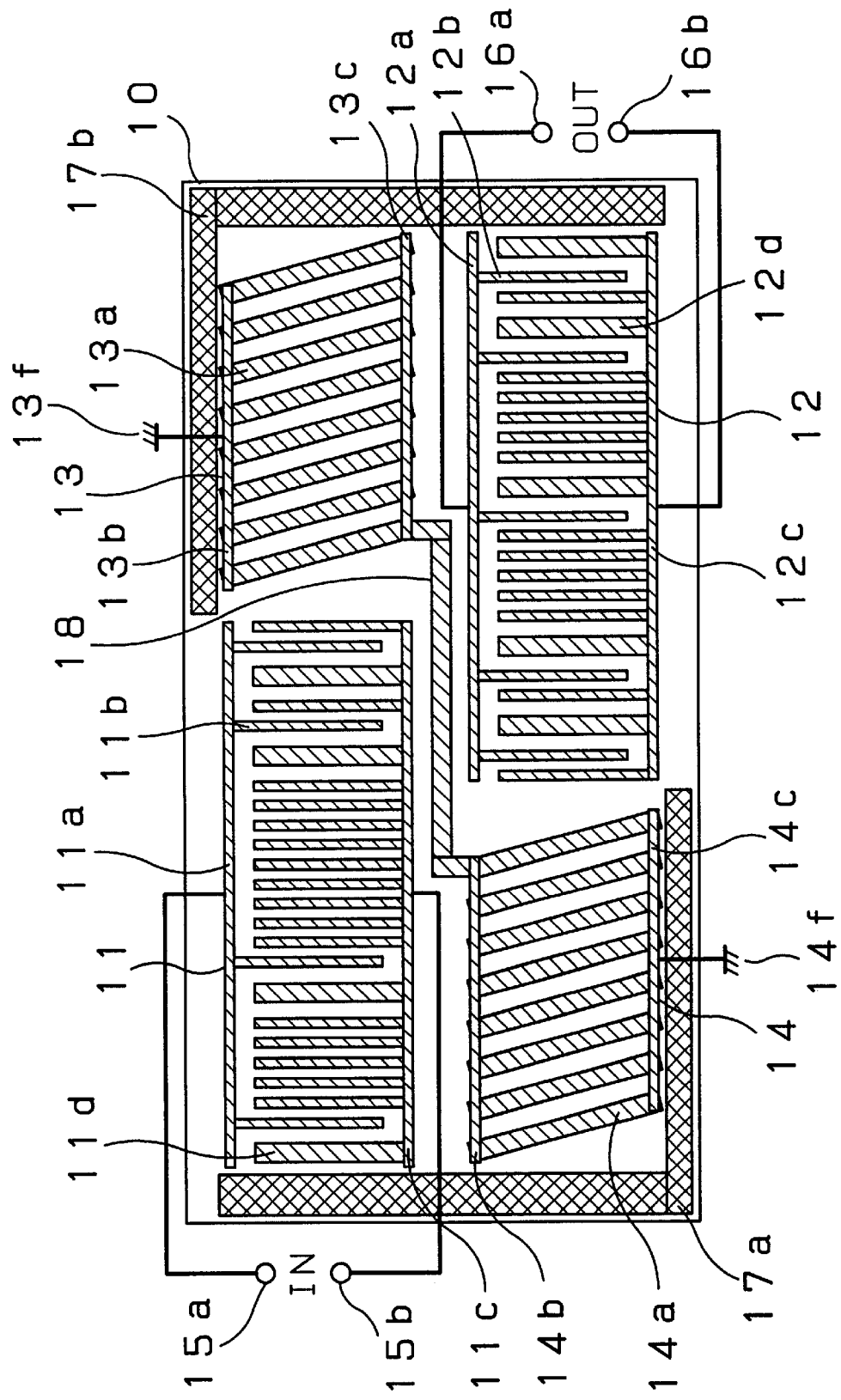
FIG. 7 is a top view of a surface acoustic wave device in a seventh exemplary embodiment of the present invention.

FIG. 7 is a top view of a surface acoustic wave device in a seventh exemplary embodiment of the present invention. Structural elements that are the same as those in FIG. 2 are designated by the same reference numerals, and description will be omitted.

The point of difference from the surface acoustic wave device of the second exemplary embodiment lies in the shape of sound-absorbing materials 17a, 17b. While in the second exemplary embodiment sound-absorbing materials were provided only at both ends in the direction of propagation of surface acoustic waves of a piezoelectric substrate 10, sound-absorbing materials 17a, 17b are formed in the seventh exemplary embodiment also at the ends parallel to the direction of propagation of surface acoustic waves of the piezoelectric substrate 10, that is, between busbars 13b, 14c and the piezoelectric substrate 10.

By employing this structure, unwanted reflection at the end faces of the piezoelectric substrate 10 may be further prevented.

Exemplary Embodiment 8

Figure 8:
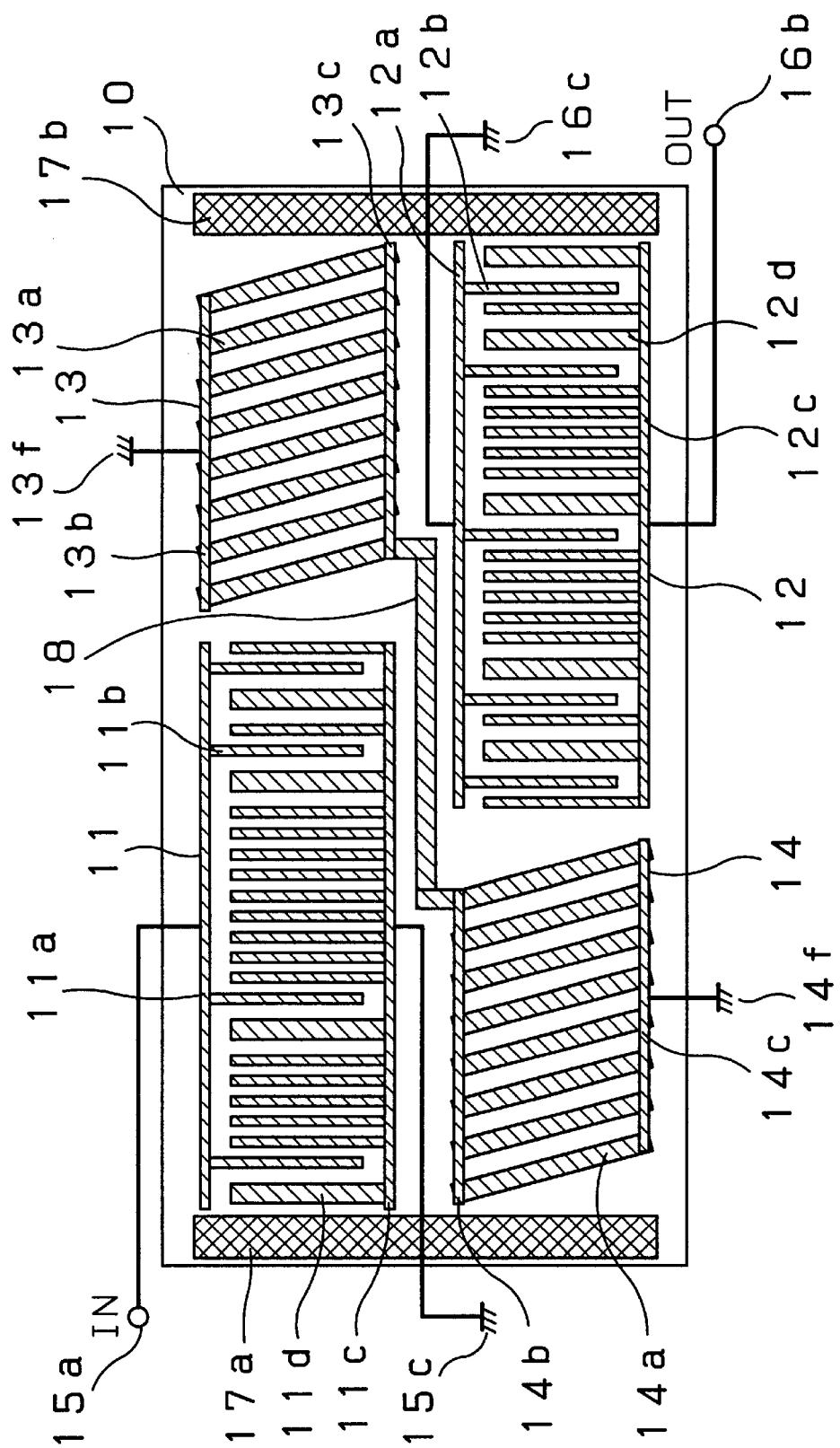
FIG. 8 is a top view of a surface acoustic wave device in an eighth exemplary embodiment of the present invention.
Figure 9:
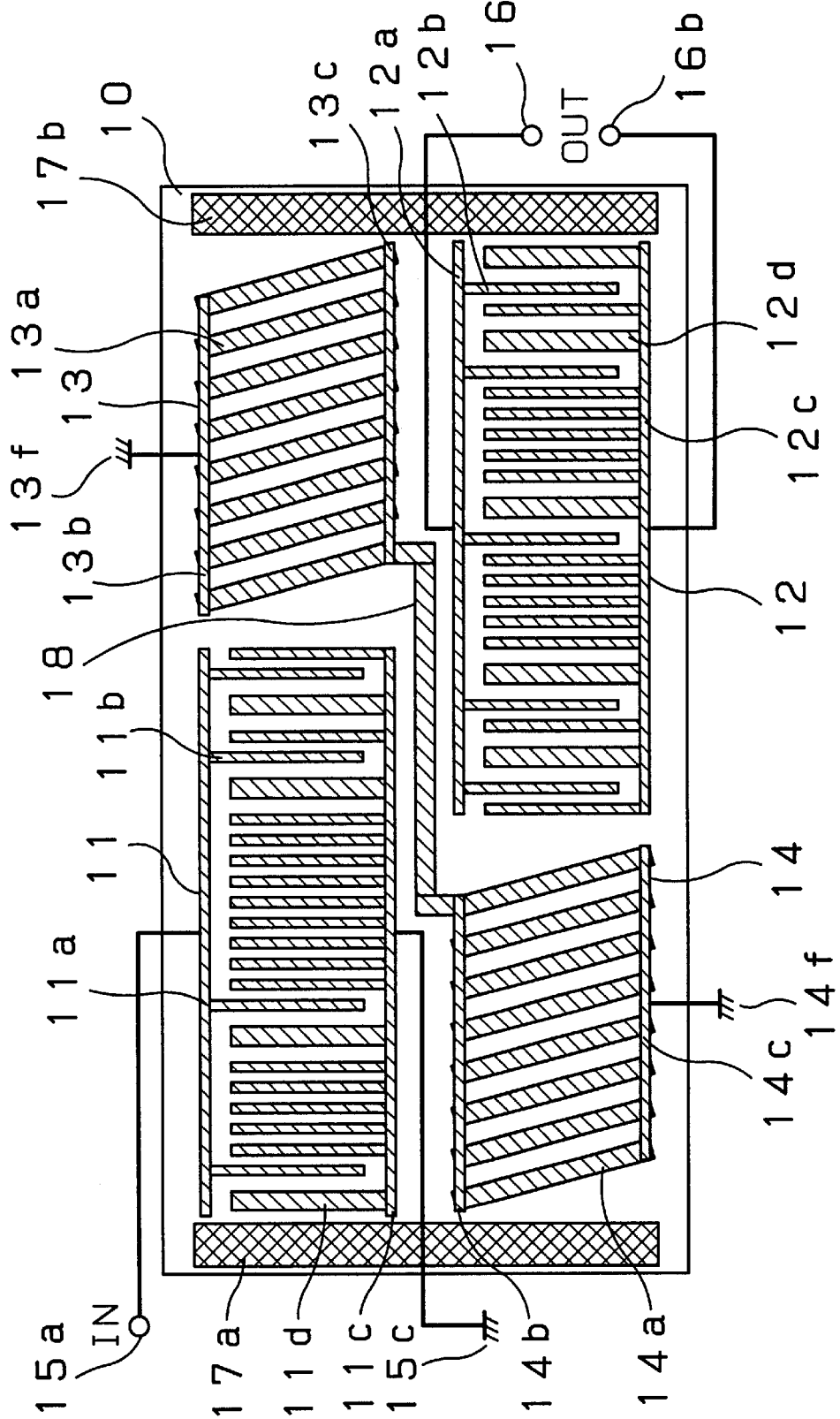
FIG. 9 is a top view of a surface acoustic wave device in the eighth exemplary embodiment of the present invention.

FIG. 8 and FIG. 9 are top views of a surface acoustic wave device in an eighth exemplary embodiment of the present invention. While a balanced-balanced type surface acoustic wave device was used in the first to seventh exemplary embodiments, the surface acoustic wave device in the eighth exemplary embodiment is of unbalanced balanced type or unbalanced-unbalanced type, where one of busbars 11a, 11c, 12a, 12c on either the input side or the output side, or on the input and output sides are connected to grounding terminals 15c, 16c.

In the case of an unbalanced type, by connecting busbars 11c, 12a on the opposing sides of the input and output IDT electrodes 11, 12 to the grounding terminals 15c, 16c in this way, shielding effect between the input and output IDT electrodes 11, 12 may be enhanced and the electromagnetic coupling between the input and output IDT electrodes 11, 12 may be prevented, thus providing a large quantity of out-of-passband attenuation.

Although not shown, same thing applies to the case of a balanced-unbalanced type.

Exemplary Embodiment 9

Figure 10:
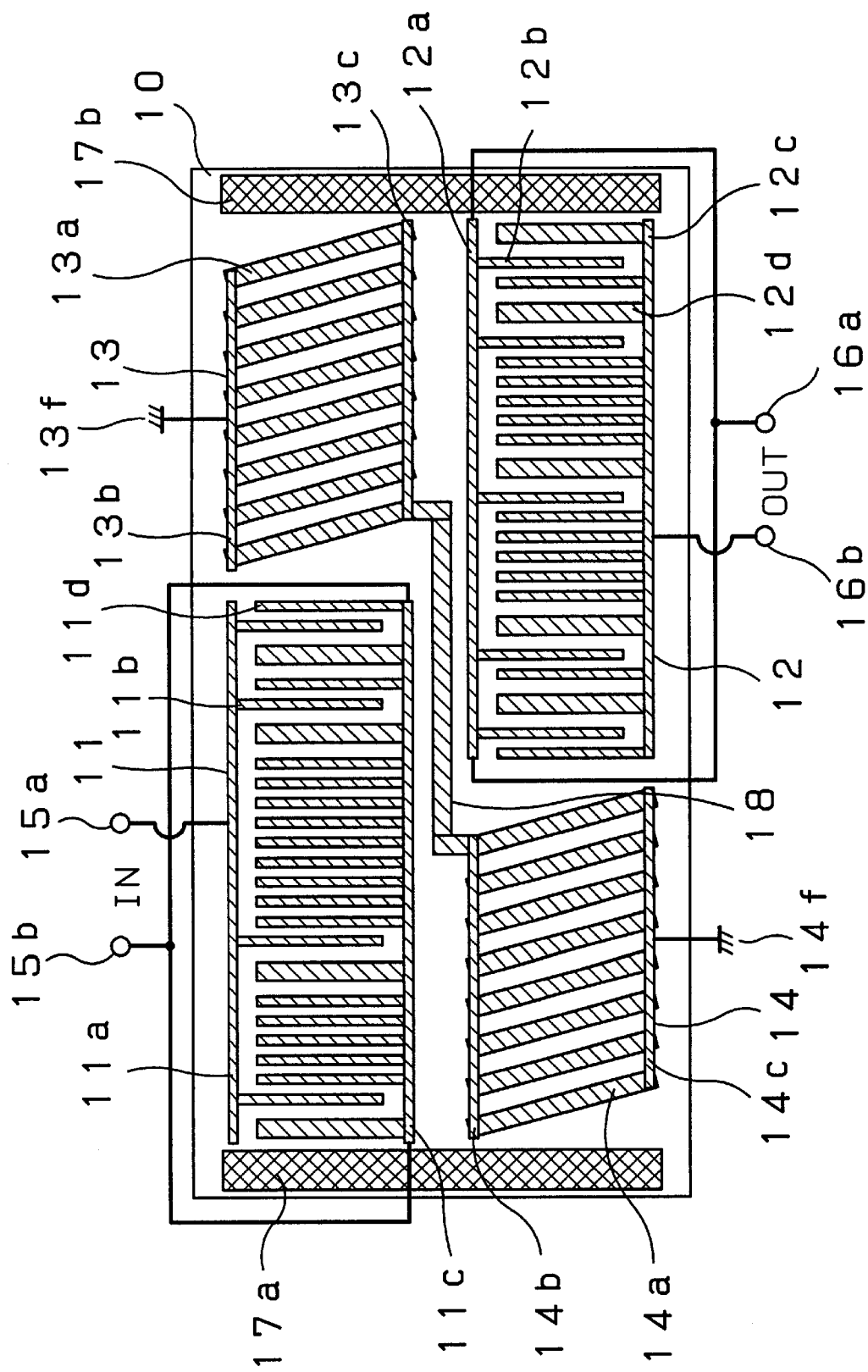
FIG. 10 is a top view of a surface acoustic wave device in a ninth exemplary embodiment of the present invention.

FIG. 10 is a top view of a surface acoustic wave device in a ninth exemplary embodiment of the present invention. Structural elements that are the same as those in FIG. 2 are designated by the same reference numerals and description will be omitted.

While in the second exemplary embodiment connection of opposing busbars 11a, 12c with the input and output terminals 15b, 16a was performed with a single cable run electrode, in the ninth exemplary embodiment, both ends of the busbars 11a, 12c and the input and output terminals 15, 16 are connected with a respective cable run electrode.

By connecting the busbars 11a, 12c and the input and output terminals 15b, 16a with plural paths in this way, the resistance loss in the busbars 11a, 12c may be reduced, and the insertion loss may be reduced.

Also, by using plural cable run electrodes in connecting the busbars 11c, 12a to the input and output terminals 15a, 16b, too, the resistance loss in the busbars 11c, 12a may be reduced, and the insertion loss may be reduced.

Exemplary Embodiment 10

Figure 11:
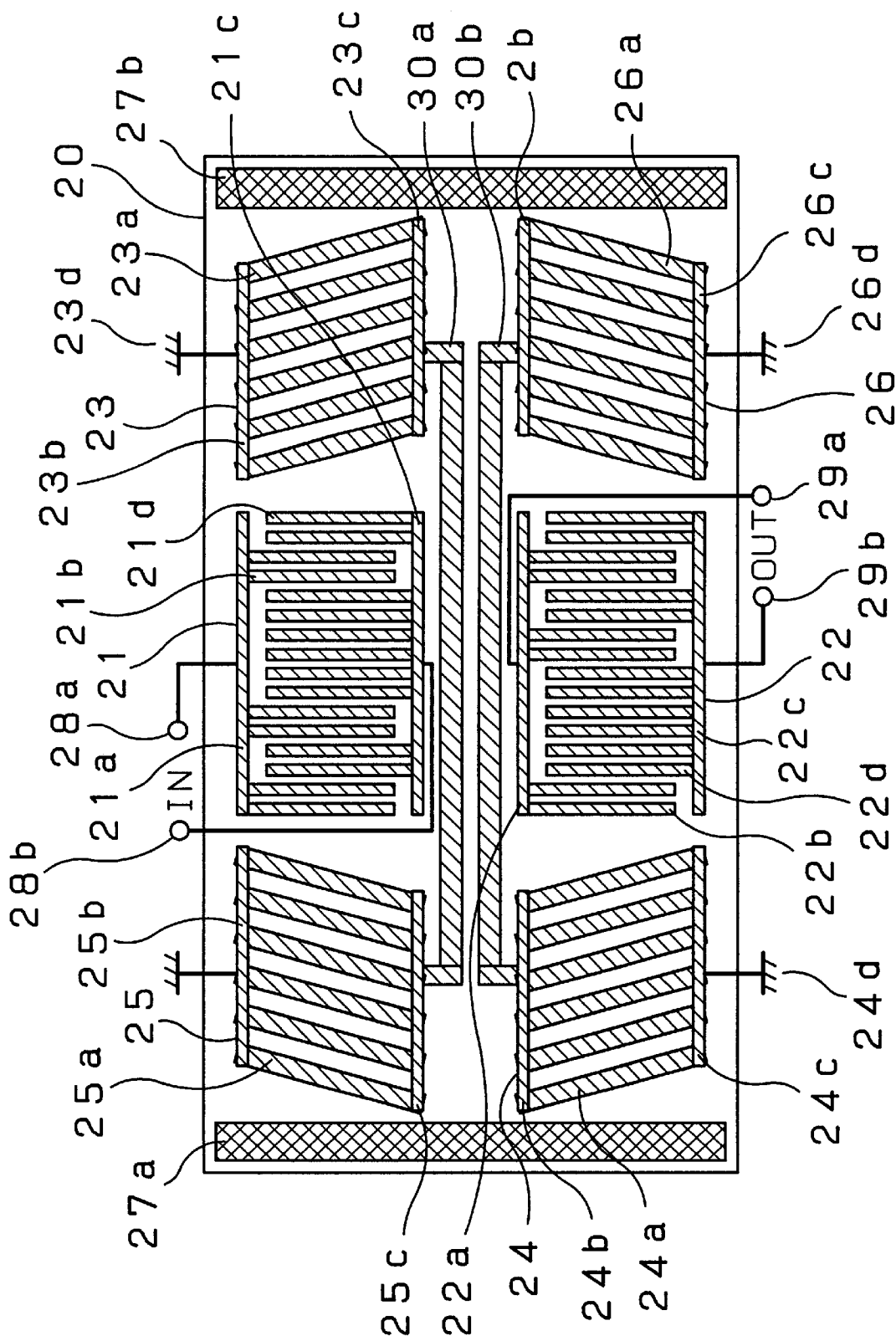
FIG. 11 is a top view of a surface acoustic wave device in a tenth exemplary embodiment of the present invention.

FIG. 11 is a top view of a surface acoustic wave device in a tenth exemplary embodiment of the present invention.

In this surface acoustic wave device, input and output IDT electrodes 21, 22 are formed on a piezoelectric substrate 20 in parallel with the direction of propagation of surface acoustic waves in a manner such that they overlap on one of their ends.

The input IDT electrode 21 is made by interdigitating a plurality of positive electrode side electrode fingers 21b connected to a busbar 21a on the positive electrode side and a plurality of negative electrode side electrode fingers 21d connected to a busbar 21c on the negative electrode side, and is connected to input terminals 28a, 28b through the busbars 21a, 21c.

The output IDT electrode 22 is made by interdigitating a plurality of positive electrode side electrode fingers 22b connected to a busbar 22a on the positive electrode side and a plurality of negative electrode side electrode fingers 22d connected to a busbar 22c on the negative electrode side, and is connected to output terminals 29a, 29b through the busbars 22a, 22c.

Each of the electrode fingers 21b, 21d, 22b, 22d has approximately the same length, a width approximately equal to ⅛ of the wavelength of surface acoustic waves, and disposed at the same pitch. Both the input and the output IDT electrodes 21, 22 are split electrodes having a structure to prevent internal reflection.

Furthermore, first and third reflector electrodes 23, 25 are provided on both sides of the input IDT electrode 21 in the direction of propagation of surface acoustic waves at a predetermined distance from the input IDT electrode 21, and second and fourth reflector electrodes 24, 26 are provided on both sides of the output IDT electrode 22 in the direction of propagation of surface acoustic waves at a predetermined distance from the output IDT electrode 22.

Furthermore, electrode fingers 23a, 24a, 25a, 26a of the reflector electrodes are inclined in a manner such that the angle formed by a plane perpendicular to the direction of propagation of surface acoustic waves of the input and output IDT electrodes 21, 22 and the electrode fingers 23a, 24a, 25a, 26a is equal to or smaller than 25 . The first to the fourth reflector electrodes 23, 24, 25, 26 are made by respectively disposing the electrode fingers 23a, 24a, 25a, 26a having approximately the same width and length at the same pitch, and the reflection coefficient is approximately unity. Consequently, the external configuration of the first to the fourth reflector electrodes 23, 24, 25, 26 are roughly a parallelogram. Also, the widths of the first to the fourth reflector electrodes 23, 24, 25, 26 in the direction perpendicular to the direction of propagation of surface acoustic waves are equal to or greater than the widths of the input and output IDT electrodes 21, 22 in the same direction.

Yet furthermore, the input and output IDT electrodes 21, 22, and the first to the fourth reflector electrodes 23, 24, 25, 26 are formed on a piezoelectric substrate 20 at positions that satisfy Equation (2).

When an electric signal is applied to the input IDT electrode 21 of a surface acoustic wave device having the above structure, surface acoustic waves are propagated to the first and the third reflector electrodes 23, 25, reflected by the first and the third reflector electrodes 23, 25, and propagated to the second and the fourth reflector electrodes 24, 26. Subsequently, the surface acoustic waves reflected for the second time by the second and the fourth reflector electrodes 24, 26 are propagated to the output IDT electrode 22, and taken out as an electric signal from the output terminals 29a, 29b. That is, the surface acoustic waves take two routes of propagation: a Z-shaped route of IDT electrode 21 first reflector electrode 23 second reflector electrode 24 output IDT electrode 22, and a reversed Z-shaped route of input IDT electrode 21 third reflector electrode 25 fourth reflector electrode 26 output IDT electrode 22. Consequently, as bi-directional surface acoustic waves that propagate in the input IDT electrode 21 can be efficiently propagated to the output IDT electrode 22, insertion loss may be further reduced when compared with the surface acoustic wave device described in the first exemplary embodiment.

Yet furthermore, the busbar 23c of the first reflector electrode 23 and the busbar 25c of the third reflector electrode 25, and the busbar 24b of the second reflector electrode 24 and the busbar 26b of the fourth reflector electrode 26 are electrically connected with respective cable run electrodes 30a, 30b, and the busbars 23b, 24c, 25b, 26c are grounded to grounding terminals 23d, 24d, 25d, 26d. These cable run electrodes 30a, 30b are provided between the input and output IDT electrodes 21, 22 on the piezoelectric substrate 20. Additionally, the cable run electrodes 30a, 30b are formed in a manner such that they have a width greater than the widest portion, i.e., the busbars 21a, 21c, 22a, 22c of the input and output IDT electrodes 21, 22, thereby further enhancing shielding effect hence preventing electromagnetic coupling between the input IDT and output IDT electrodes 21, 22 and increasing the quantity of out-of-passband attenuation.

Though the first to the fourth reflector electrodes 23, 24, 25, 26 may be connected to the grounding terminals with a single cable run electrode, in order to obtain a high shielding effect it is preferable to connect the first reflector electrode 23 and the third reflector electrode 25 on both sides of the input IDT electrode 21, and the third reflector electrode 24 and the fourth reflector electrode 26 on both sides of the output IDT electrode 22, with respective separate cable run electrodes 30a, 30b as described in the tenth exemplary embodiment.

In addition, it is preferable to separately ground the grounding terminals 23d, 25d, and the grounding terminals 24d, 26d.

The reflector electrodes to be provided with the input and the output IDT electrodes 21, 22 in between are of the same structure. Namely, the first reflector electrode 23 and the third reflector electrode 25 are of the same structure, and the second reflector electrode 24 and the fourth reflector electrode 26 are of the same structure. Also, as shown in the fourth exemplary embodiment, by making the first reflector electrode 23 and the second reflector electrode 24 different in structure such as by changing width of at least some of the electrode fingers 23a, 24a as shown in the fourth exemplary embodiment, it is possible to assign weighting to the reflection characteristic of the reflector electrodes as shown in the fourth exemplary embodiment, make the out-of-passband reflection efficiency small, and increase the quantity of out-of-passband attenuation.

Same thing as said in the above described fifth to the ninth exemplary embodiments may be said on the surface acoustic wave device of the tenth exemplary embodiment. Namely, by providing electrode fingers having the same pitch, width, and angle of inclination as the electrode fingers 23a, 24a, 25a, 26a of the first to the fourth reflector electrodes 23, 24, 25, 26 but shorter in length at the ends of the first to the fourth reflector electrodes 23, 24, 25, 26 toward the input and output IDT electrodes 21, 22 as described in the fifth exemplary embodiment, a filter waveform close to a rectangle may be obtained. Also, by providing at the ends of the first to the fourth reflector electrodes 23, 24, 25, 26 toward the input and output IDT electrodes 21, 22 in parallel to the electrode fingers 21d, 22d electrode fingers having a width approximately equal to ⅛ of the wavelength of surface acoustic waves to which ends of the electrode fingers 23b, 23d, 24b, 24d are to be connected, unwanted reflection may be prevented.

Furthermore, similar effect may be obtained by providing similar electrode fingers on the sides of the first to the fourth reflector electrodes 23, 24, 25, 26 toward ends of the piezoelectric substrate 20 as was shown in the sixth exemplary embodiment. Needless to say, better effect may be obtained by providing electrode fingers on both sides.

In the above described tenth exemplary embodiment, although sound-absorbing materials 27a, 27b are formed at the ends of the piezoelectric substrate 20 in the direction of propagation of surface acoustic waves of the input and output IDT electrodes 21, 22, unwanted reflection at the end faces of the piezoelectric substrate 20 may be further prevented by also forming at the ends parallel to the direction of propagation of surface acoustic waves of the piezoelectric substrate 20.

Also, while the above-described surface acoustic wave device is of a balanced-balanced type, in the case of an unbalanced-balanced, unbalanced-unbalanced, or balanced-unbalanced type, it is preferable to connect the opposing busbars 21c, 22a of the input and output IDT electrodes 21, 22 to the grounding terminals.

Furthermore, though the connection between the opposing busbars 21c, 22a of the input and output IDT electrodes 21, 22 and the input and output terminals 28b, 29a is done with a single cable run electrode, by connecting the busbars 21c, 22a and the input and output terminals 28b, 29a with plural cable run electrodes, resistance loss in the busbars 21c, 22a may be reduced, thus lowering insertion loss.

Exemplary Embodiment 11

Figure 12:
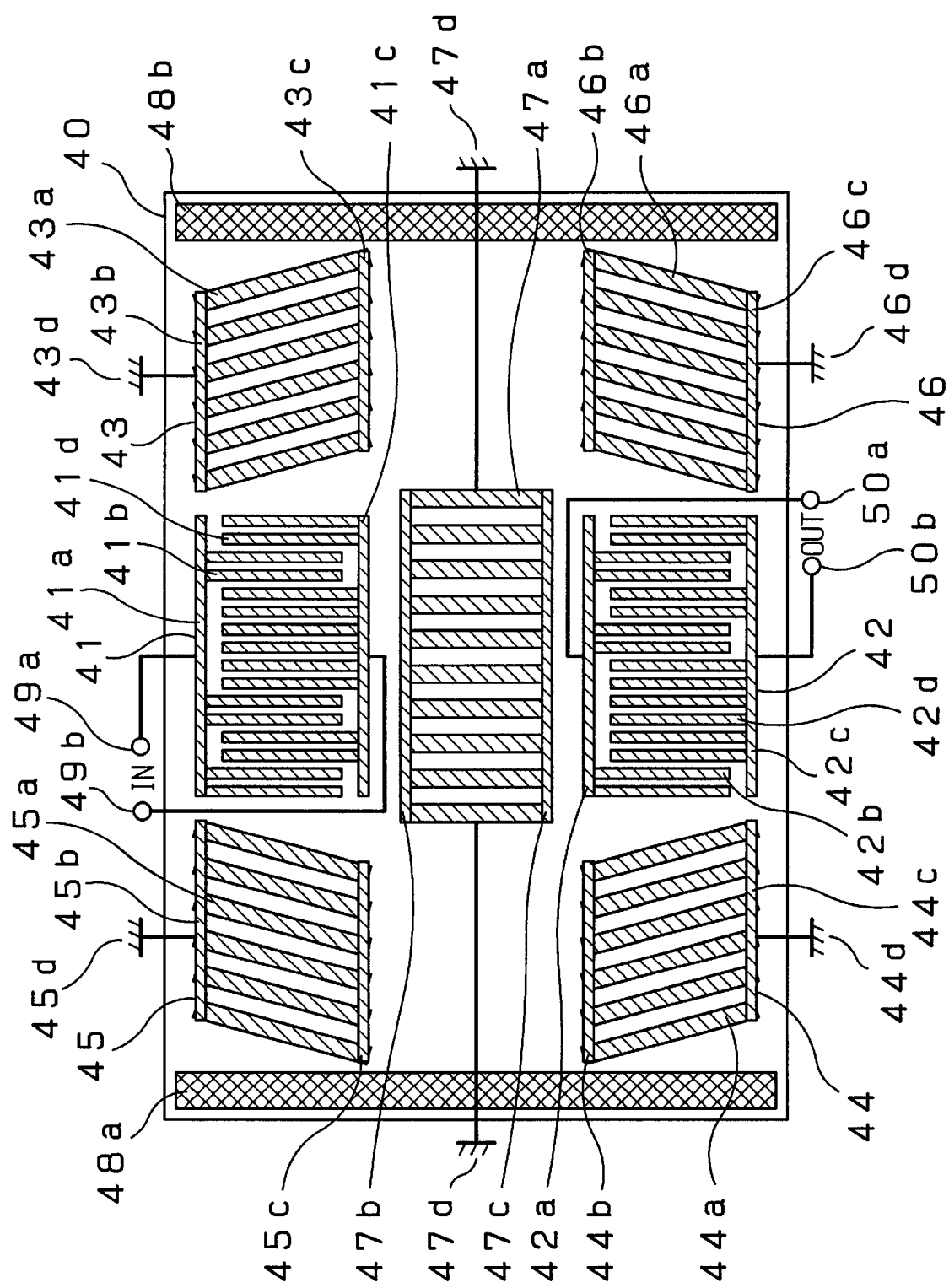
FIG. 12 is a top view of a surface acoustic wave device in an eleventh exemplary embodiment of the present invention.

FIG. 12 is a top view of a surface acoustic wave device in an eleventh exemplary embodiment of the present invention.

In this surface acoustic wave device, input and output IDT electrodes 41, 42 are provided on a piezoelectric substrate 40 parallel to the direction of propagation of surface acoustic waves and in a manner such that they overlap with a fifth reflector electrode 47 in between.

The input IDT electrode 41 is made by interdigitating a plurality of electrode fingers 41b on the side of the positive electrode connected to a busbar 41a on the positive electrode side and a plurality of electrode fingers 41d on the side of the negative electrode connected to a busbar 41c on the side of the negative electrode, thereby being connected to input terminals 49a, 49b through the busbars 41a, 41c.

The output IDT electrode 42 is made by interdigitating a plurality of electrode fingers 42b on the side of the positive electrode connected to a busbar 42a on the positive electrode side and a plurality of electrode fingers 42d on the side of the negative electrode connected to a busbar 42c on the side of the negative electrode, thereby being connected to input terminals 50a, 50b through the busbars 42a, 42c.

Each of the electrode fingers 41b, 41d, 42b, 42d has approximately the same length with a width approximately equal to ⅛ of the wavelength of the surface acoustic waves and disposed at the same pitch, and both the input and output IDT electrodes 41, 42 are split electrodes with a structure to prevent internal reflection.

First and third reflector electrodes 43, 45 are provided on both sides of the input IDT electrode 41 in the direction of propagation of the surface acoustic waves at a predetermined distance from the input IDT electrode 41. Second and fourth reflector electrodes 44, 46 are provided on both sides of the output IDT electrode 42 in the direction of propagation of the surface acoustic waves of the output IDT electrode 42 at a predetermined distance from the output IDT electrode 42. In addition, electrode fingers 43a, 44a, 45a, 46a are inclined in a manner such that the angle formed by a plane perpendicular to the direction of propagation of surface acoustic waves of the input and output IDT electrodes 41, 42 and the electrode fingers 43a, 44a, 45a, 46a is equal to or smaller than 25. Each of the first to the fourth reflector electrodes 43, 44, 45, 46 is made by disposing respective electrode fingers 43a, 44a, 45a, 46a having approximately the same width and length at the same pitch and connecting to each respective grounding terminals 43d, 44d, 45d, 46d. Also, the reflection coefficient is approximately unity. Consequently, the outer configuration of the first to the fourth reflector electrodes 43, 44, 45, 46 is roughly a parallelogram. Also, the widths of the first to the fourth reflector electrodes 43, 44, 45, 46 in the direction perpendicular to the direction of propagation of the surface acoustic waves are equal to or greater than the widths in the same direction of the input and output IDT electrodes 41, 42.

Also, the input and output IDT electrodes 41, 42, and the first to the fourth reflector electrodes 43, 44, 45, 46 are formed on the piezoelectric substrate 40 at positions that satisfy Equation (2).

A fifth reflector electrode 47 provided between the input and output IDT electrodes 41, 42 has a plurality of electrode fingers 47a having the same shape with each of their ends respectively electrically connected to busbars 47b, 47c, and the electrode fingers 41b, 41d, 42b, 42d of the input and output IDT electrodes 41, 42 are provided in parallel with the electrode fingers 47a. As a result, the external configuration of the fifth reflector electrode 47 is a rectangle. In addition, the length in the direction of propagation of surface acoustic waves of the fifth reflector electrode 47 is made equal to or greater than the length in the same direction of the input and output IDT electrodes 41, 42. The electrode fingers 47a on both sides closest to the ends of the piezoelectric substrate 40 in the direction of propagation of surface acoustic waves of the input and output IDT electrodes 41, 42 are respectively electrically connected to grounding terminals 47d. As a result, the fifth reflector electrode 47 works also as a shielding electrode thereby preventing electromagnetic coupling between the input and output IDT electrodes 41, 42.

In a surface acoustic wave device of the above structure, when an electric signal is inputted to the input terminals 49a, 49b, it reaches at the output terminals 50a, 50b through any one of the following propagation routes.

First is the input IDT electrode 41 first reflector electrode 43 second reflector electrode 44 output IDT electrode 42 route; second is the input IDT electrode 41 third reflector electrode 45 fourth reflector electrode 46 output IDT electrode 42 route; third is the input IDT electrode 41 first reflector electrode 43 fifth reflector electrode 47 fourth reflector electrode 46 output IDT electrode 42 route; and fourth is the input IDT electrode 41 third reflector electrode 45 fifth reflector electrode 47 second reflector electrode 44 output IDT electrode 42 route, totaling four propagation routes.

Accordingly, as bi-directional surface acoustic waves propagating through the input IDT electrode 41 are efficiently propagated to the output IDT electrode 42, insertion loss may be further reduced when compared with the surface acoustic wave device described in the first exemplary embodiment.

Also, the reflector electrodes provided with the input and output IDT electrodes 41, 42 in between have the same structure. That is, the first reflector electrode 43 and the third reflector electrode 45 have the same structure, and the second reflector electrode 44 and the fourth reflector electrode 46 have the same structure. Also, by making the structure of the first reflector electrode 43 different from that of the second reflector electrode 44 by changing, for example, the width of at least some of the electrode fingers 43a, 44a as in the fourth exemplary embodiment, weighting may be assigned to the reflection characteristic of the reflector electrodes thus reducing out-of-passband reflection efficiency and increasing the quantity of out-of-passband attenuation.

Same thing as said in the above described fifth to the tenth exemplary embodiments may be said on the surface acoustic wave device of the eleventh exemplary embodiment.

Namely, by providing electrode fingers having the same pitch, width, and angle of inclination as the electrode fingers 43a, 44a, 45a, 46a of the first to the fourth reflector electrodes 43, 44, 45, 46 but shorter in length at the ends toward the input and output IDT electrodes 41, 42 of the first to the fourth reflector electrodes 43, 44, 45, 46 as described in the fifth exemplary embodiment, a surface acoustic wave device having a filter waveform close to a rectangle may be obtained. Also, similar effect may be obtained by providing similar electrode fingers on the sides of the first to the fourth reflector electrodes 43, 44, 45, 46 toward an end of the piezoelectric substrate 40 as was shown in the sixth exemplary embodiment. Needless to say, better effect may be obtained by providing similar electrode fingers on both sides.

In the above described eleventh exemplary embodiment, although sound-absorbing materials 48a, 48b are formed at the ends of the piezoelectric substrate 40 in the direction of propagation of surface acoustic waves of the input and output IDT electrodes 41, 42, unwanted reflection at the end faces of the piezoelectric substrate 40 may be further prevented by also forming at the ends parallel to the direction of propagation of surface acoustic waves of the piezoelectric substrate 40.

Also, while the above-described surface acoustic wave device is of a balanced-balanced type, in the case of an unbalanced-balanced, unbalanced-unbalanced, or balanced-unbalanced type, it is preferable to connect the opposing busbars 41c, 42a of the input and output IDT electrodes 41, 42 to the grounding terminals.

Furthermore, though the connection between the busbars 41a, 41c, 42a, 42c of the input and output IDT electrodes 41, 42 and the input and output terminals 49a, 49b, 50a, 50b is done with a single cable run electrode, by connecting the busbars 41a, 41c, 42a, 42c and the input and output terminals 49a, 49b, 50a, 50b with plural cable run electrodes, resistance loss in the busbars 41a, 41c, 42a, 42c may be reduced, thus lowering the insertion loss.

Now, a description will be given on the points common to the surface acoustic wave devices of the present invention.

(1) By making metalization ratios of the first to the fifth reflector electrodes 13, 14, 23, 24, 25, 26, 43, 44, 45, 46, 47 to within the range 0.45 to 0.75, surface acoustic waves may be efficiently reflected and hence miniaturization of reflector electrodes may be achieved. Here, the metalization ratio is defined as the ratio between the width of an electrode finger and the inter-electrode finger space. It is a factor that affects the reflection efficiency of surface acoustic waves as well as the temperature characteristic as will be described later.

(2) By changing the reflection characteristic of the first reflector electrodes 13, 23, 43 and that of the second reflector electrodes 14, 24, 44 by changing the width and number of the electrode fingers 13a, 14a, 23a, 24a, 43a, 44a, a surface acoustic wave device having a large quantity of out-of-passband attenuation may be obtained.

(3) As the piezoelectric substrates 10, 20, 40, single crystal substrates of rock crystal, $LiTaO_3$, $LiNbO_3$ or the like are employed.

(4) The input and output IDT electrodes 11, 12, 21, 22, 41, 42, the first to the fifth reflector electrodes 13, 14, 23, 24, 25, 26, 43, 44, 45, 46, 47, and the cable run electrodes 18, 30a, 30b are formed by using a metal having aluminum as the main constituent.

(5) The structures of the input IDT electrodes 11, 21, 41 and the output IDT electrodes 12, 22, 42 may be different, but size reduction of surface acoustic wave devices may be easier when their sizes are similar.

(6) By making the widths in the direction perpendicular to the direction of propagation of surface acoustic waves of the first to the fifth reflector electrodes 13, 14, 23, 24, 25, 26, 43, 44, 47 greater than those of the input and output IDT electrodes 11, 12, 21, 22, 41, 42, the reflection efficiency of surface acoustic waves may be improved.

(7) Insertion loss may be made smaller by making the reflection coefficients of the first to the fifth reflector electrodes 13, 14, 23, 24, 25, 26, 43, 44, 45, 46, 47 equal to or greater than 0.9 and as much closer to unity as possible.

(8) The effect of preventing unwanted reflected waves may be enhanced by forming the sound-absorbing materials 17a, 17b, 27a, 27b, 48a, 48b as large as possible between the first to the fifth reflector electrodes 13, 14, 23, 24, 25, 26, 43, 44, 45, 46, 47 and the ends of the piezoelectric substrates 10, 20, 40.

(9) While in the third to the sixth exemplary embodiments, both the input and output IDT electrodes 11, 12 were unidirectional electrodes, propagation efficiency of surface acoustic waves may be enhanced by employing unidirectional electrode even in one of them when compared with the first exemplary embodiment.

(10) By providing the cable run electrodes 18, 30a, 30b which also work as shielding electrodes at least in the opposing portions between the input and output IDT electrodes 11, 12, 21, 22, 41, 42, an electromagnetic coupling between the input and output IDT electrodes is suppressed. The shielding effect may further be improved by forming the cable run electrodes 18, 30a, 30b as large as possible.

(11) When using rock crystal as the piezoelectric substrates 10, 20, 40, the temperature characteristic (frequency drift) assumes a second-order curve. If its peak temperature can be set at the center (normally room temperature) of the desired temperature range, the frequency drift becomes small over the entire temperature range.

Therefore, when forming the piezoelectric substrates 10, 20, 40 with rock crystal, the peak temperature in the frequency drift depends on the cutting angle of the piezoelectric substrates 10, 20, 40, and film thicknesses and metalization ratios of the input and output IDT electrodes 11, 12, 21, 22, 41, 42, and the first to the fifth reflector electrodes 13, 14, 23, 24, 25, 26, 43, 44, 45, 46, 47. Consequently, as the difference in the metalization ratios of the input and output IDT electrodes 11, 12, 21, 22, 41, 42, and the first to the fifth reflector electrodes 13, 14, 23, 24, 25, 26, 43, 44, 45, 46, 47 increases, the respective peak temperature differs greatly, thus presenting harmful effect of a great change in the filter characteristic with temperature. It is thus preferable that the difference in metalization ratios of the input and output IDT electrodes 11, 12, 21, 22, 41, 42, and the first to the fifth reflector electrodes 13, 14, 23, 24, 25, 26, 43, 44, 45, 46, 47 be 0.15, preferably 0.1 or smaller. Also, it is preferable that the difference in the metalization ratios between the first reflector electrodes 13, 23, 43 and the second reflector electrodes 14, 24, 44 be about 0.05.

Exemplary Embodiment 12

Figure 13:
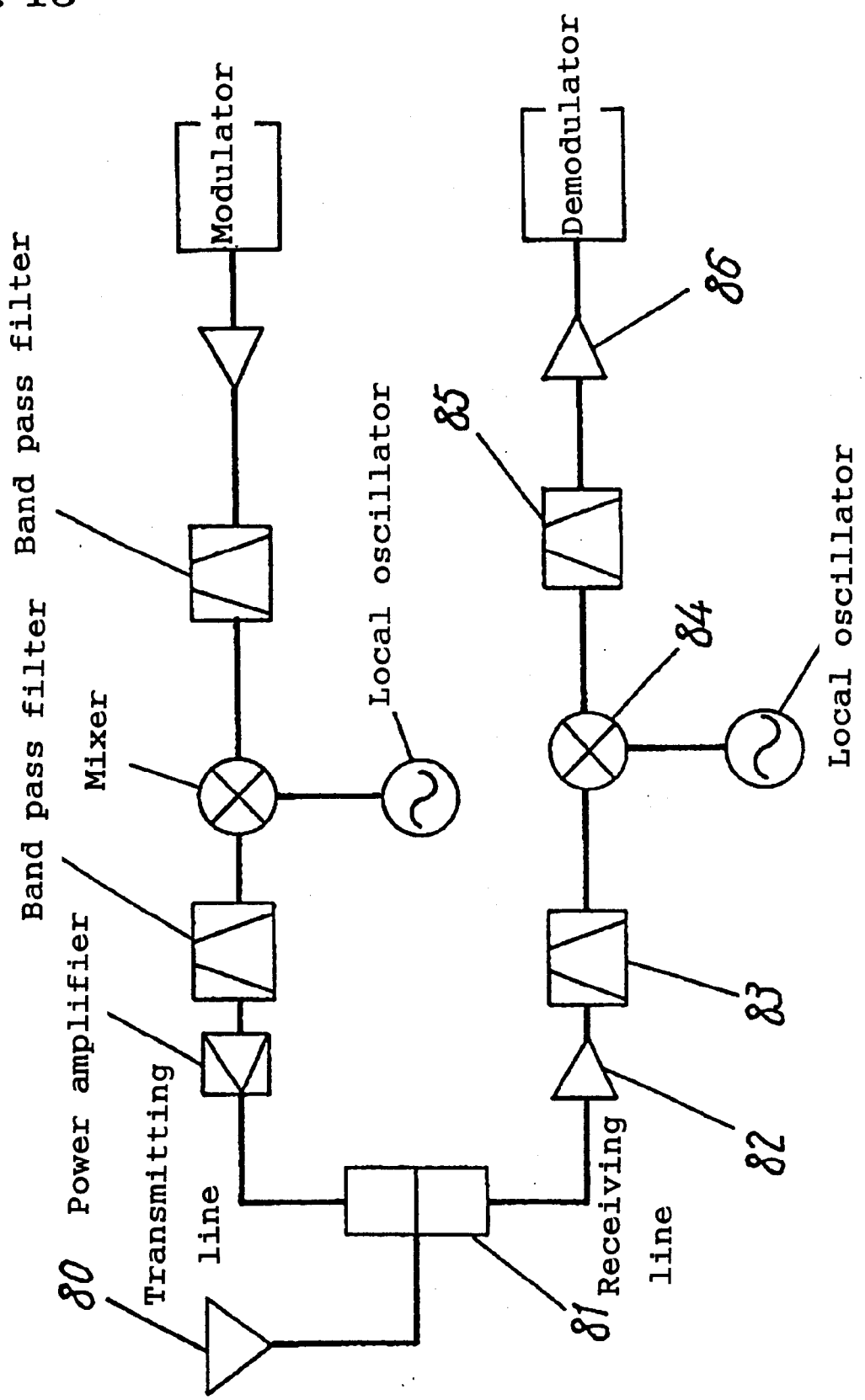
FIG. 13 is a top view of a surface acoustic wave device in a twelfth exemplary embodiment of the present invention.
Figure 14:
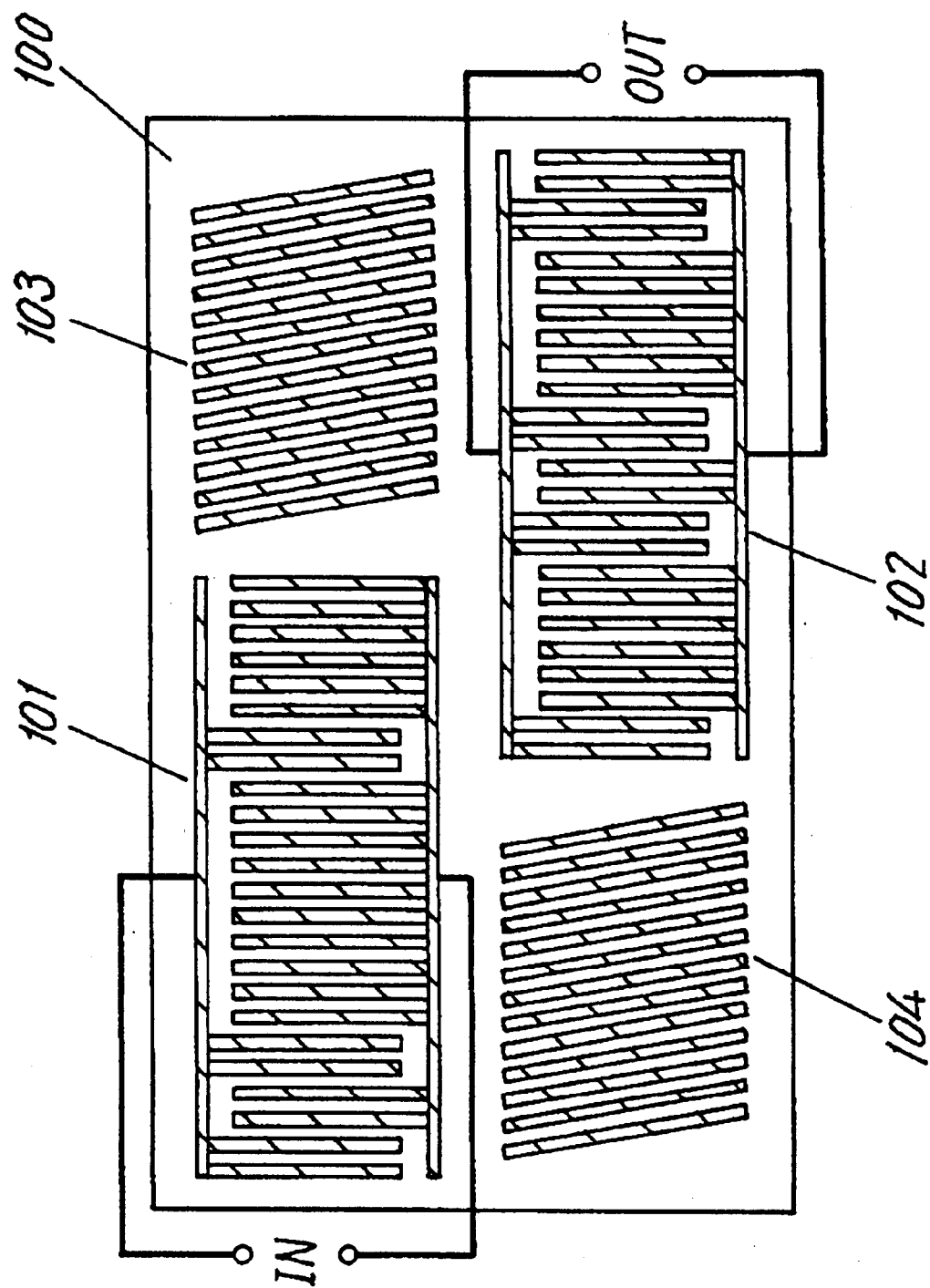
FIG. 14 is a top view of a conventional surface acoustic wave device.

FIG. 13 is a transmit/receive circuit diagram of a communications device.

While surface acoustic wave devices of the present invention may be used as an IF transmit/receive bandpass filters, a description will be given on a receive circuit as surface acoustic wave devices are more often used as IF bandpass filters of receive circuits. The receive circuit of FIG. 13 is a super heterodyne circuit, where radio waves received by an antenna 80 are branched by an antenna divider 81, and converted into an intermediate frequency by a mixer 84 after passing through an LNA 82 and an RF bandpass filter 83. A surface acoustic wave device in accordance with the present invention is connected to the output side of the mixer 84 and is used as an IF bandpass filter 85 that passes the intermediate frequency. By using a surface acoustic wave device of the present invention, it is possible to reduce the number of elements of an IF amplifier 86 and hence the power dissipation of the IF amplifier 86 thereby providing a communications device with a good cost performance.

Industrial Applicability

The present invention provides a surface acoustic wave device having superior in-passband characteristic by allowing efficient propagation of surface acoustic waves from the input IDT electrode to the output IDT electrode.

What is claimed is:

1. A surface acoustic wave device comprising a piezoelectric substrate, input and output interdigital transducer (IDT) electrodes provided on said piezoelectric substrate in a manner such that the direction of propagation of surface acoustic waves is parallel, a first reflector electrode provided on the output side of said surface acoustic waves at a predetermined distance from said input interdigital transducer electrode, and a second reflector electrode provided at a predetermined distance from said output interdigital transducer electrode in a manner such that said surface acoustic waves reflected by said first reflector electrode can be reflected and propagated to said output interdigital transducer electrode, wherein Equation 1 is satisfied:

$$2(\theta-5) \leq \tan^{-1}(D/L) \leq 2(\theta+5) \qquad (1)$$

where $\theta$: angle of inclination of said first or said second reflector electrode relative to a plane perpendicular to the direction of propagation of surface acoustic waves of said input and output IDT electrodes in degrees (excluding zero degree);

D: center-to-center distance in $\mu$m of the widths of said input and output IDT electrodes in the direction perpendicular to the direction of propagation of surface acoustic waves;

L: center-to-center distance in $\mu$m of said first and second reflector electrodes.

2. The surface acoustic wave device of claim 1 wherein $\theta$ is equal to or smaller than 25°.

3. The surface acoustic wave device of claim 1 wherein reflection coefficients of said first and second reflector electrodes are approximately equal to unity.

4. The surface acoustic wave device of claim 1 wherein at least one of said input and output interdigital transducer electrodes is a unidirectional electrode.

5. The surface acoustic wave device of claim 1 wherein said first and second reflector electrodes are electrically connected and grounded with a cable run electrode provided between said input and output interdigital transducer electrodes.

6. The surface acoustic wave device of claim 5 wherein said first and second reflector electrodes are divided into plural units.

7. The surface acoustic wave device of claim 5 wherein said cable run electrode is made broader than busbars of said input and output interdigital transducer electrodes.

8. The surface acoustic wave device of claim 1 wherein an electrode finger having the same pitch, width, angle of inclination as those of the electrode fingers of said reflector electrodes but shorter in length is provided at at least one of the ends toward said input and output interdigital transducer electrodes of said reflector electrodes.

9. The surface acoustic wave device of claim 8 wherein an electrode finger having a width approximately equal to ⅛ of the wavelength of surface acoustic waves is provided in parallel with the electrode fingers of said interdigital transducer electrodes for connecting ends of electrode fingers at the ends toward said interdigital transducer electrodes of said reflector electrodes provided with a short electrode finger.

10. The surface acoustic wave device of claim 1 wherein reflection characteristic of said first reflector electrode is made different from that of said second reflector electrode.

11. The surface acoustic wave device of claim 1 wherein metalization ratios of said first and second reflector electrodes are in the range 0.45 to 0.75.

12. The surface acoustic wave device of claim 11 wherein at least one of said input and output interdigital transducer electrodes is comprised of a split electrode having an electrode finger width approximately equal to $\lambda$/8 ($\lambda$ being wavelength of surface acoustic waves).

13. The surface acoustic wave device of claim 1 wherein a third reflector electrode is provided at a predetermined distance from said input interdigital transducer electrode on the side opposite the side of said input interdigital transducer electrode where said first reflector electrode is provided, and a fourth reflector electrode is provided at a predetermined distance from said output interdigital transducer electrode on the side opposite the side of said output interdigital transducer electrode where said second reflector electrode is provided.

14. The surface acoustic wave device of claim 1 wherein width of some of the electrode fingers of the reflector electrodes is greater than the widths of other electrode fingers.

15. The surface acoustic wave device of claim 1 wherein, when the input and output terminals of said surface acoustic wave device are of an unbalanced type, input and output terminals on the side of the opposing input and output interdigital transducer electrodes are grounded.

16. The surface acoustic wave device of claim 1 wherein a sound-absorbing material is provided between said first and second reflector electrodes and the end in the direction of propagation of surface acoustic waves of said piezoelectric substrate.

17. The surface acoustic wave device of claim 16 wherein a sound-absorbing material is provided also between said first and second reflector electrodes and the end parallel to the direction of propagation of surface acoustic waves of said piezoelectric substrate.

18. A surface acoustic wave device comprising a piezoelectric substrate, input and output interdigital transducer (IDT) electrodes provided in parallel on said piezoelectric substrate, first to fourth reflector electrodes provided on both sides of said input and output interdigital transducer electrodes, a fifth reflector electrode provided between said input and output interdigital transducer electrodes, wherein said first to fourth reflector electrodes are inclined by approximately the same angle relative to a plane perpendicular to the direction of propagation of surface acoustic waves.

19. The surface acoustic wave device of claim 18 wherein Equation (2) is satisfied:

$$2(\theta-5) \leq \tan^{-1}(D/L) \leq 2(\theta+5) \qquad (2)$$

where $\theta$: angle of inclination in degrees (excluding zero degree) of at least one of said first to fourth reflector electrodes relative to a plane perpendicular to the direction of propagation of surface acoustic waves of said input and output IDT electrodes;

D: center-to-center distance in $\mu$m of the widths of said input and output IDT electrodes in the direction perpendicular to the direction of propagation of surface acoustic waves;

L: center-to-center distance in $\mu$m of said first and second reflector electrodes.

20. The surface acoustic wave device of claim 19 wherein $\theta$ is equal to or smaller than 25°.

21. The surface acoustic wave device of claim 18 wherein the reflection coefficient of said reflector electrodes is approximately unity.

22. The surface acoustic wave device of claim 18 wherein at least one of said input and output interdigital transducer electrodes is comprised of a split electrode having an electrode finger width approximately equal to $\lambda/8$ ($\lambda$ being the wavelength of surface acoustic waves).

23. The surface acoustic wave device of claim 18 wherein said fifth reflector electrode is grounded.

24. The surface acoustic wave device of claim 18 wherein an electrode finger having the same pitch, width, angle of inclination as those of the electrode fingers of said reflector electrodes but shorter in length is provided at at least one of the ends of said reflector electrodes toward said input and output interdigital transducer electrodes.

25. The surface acoustic wave device of claim 24 wherein an electrode finger having a width approximately equal to ⅛ of the wavelength of surface acoustic waves is provided in parallel with the electrode fingers of said interdigital transducer electrodes for connecting ends of electrode fingers at the end toward said interdigital transducer electrodes of the reflector electrodes provided with a short electrode finger.

26. The surface acoustic wave device of claim 18 wherein reflection characteristic of said first and second reflector electrodes is different from that of said third and fourth reflector electrodes.

27. The surface acoustic wave device of claim 18 wherein metalization ratios of said first to fifth reflector electrodes are in the range 0.45 to 0.75.

28. The surface acoustic wave device of claim 18 wherein the width of some electrode finger in at least one of said first to fifth reflector electrodes is greater than the width of other electrode fingers.

29. The surface acoustic wave device of claim 18 wherein, when the input and output terminals of said surface acoustic wave device are of an unbalanced type, the input and output terminals on the side of opposing input and output interdigital transducer electrodes are grounded.

30. The surface acoustic wave device of claim 18 wherein asound-absorbing material is provided between said first to fifth reflector electrodes and the end in the direction of propagation of surface acoustic waves of said piezoelectric substrate.

31. The surface acoustic wave device of claim 30 wherein asound-absorbing material is provided also between said first to fourth reflector electrodes and the end in the direction parallel to the direction of propagation of surface acoustic waves of said piezoelectric substrate.

32. A communications device comprising a mixer, a surface acoustic wave device the input side of which being connected to the output side of said mixer, and an amplifier the input side of which being connected to the output side of said surface acoustic wave device, said surface acoustic wave device further comprising a piezoelectric substrate, input and output interdigital transducer electrodes provided on said piezoelectric substrate in a manner such that the directions of propagation of surface acoustic waves are parallel, a first reflector electrode provided at a predetermined distance from said input interdigital transducer electrode toward said output side of said surface acoustic waves, a second reflector electrode provided at a predetermined distance from said output interdigital transducer electrode in a manner such that it reflects the surface acoustic waves reflected by said first reflector electrode and propagates to said output interdigital transducer electrode, wherein Equation (1) is satisfied:

$$2(\theta-5) \leq \tan^{-1}(D/L) \leq 2(\theta+5) \qquad (1)$$

where $\theta$: angle of inclination in degrees (excluding zero degree) of said first or said second reflector electrode relative to a plane perpendicular to the direction of propagation of surface acoustic waves of said input and output IDT electrodes;

D: center-to-center distance in $\mu$m of the widths of said input and output IDT electrodes in the direction perpendicular to the direction of propagation of surface acoustic waves;

L: center-to-center distance in $\mu$m of said first and second reflector electrodes.

\* \* \* \* \*